US012716955B2

(12) United States Patent
Niu et al.

(10) Patent No.: US 12,716,955 B2
(45) Date of Patent: Aug. 25, 2026

(54) LEBESGUE SAMPLING-BASED DEEP BELIEF NETWORK FOR LITHIUM-ION BATTERY DIAGNOSIS AND PROGNOSIS

(71) Applicant: UNIVERSITY OF SOUTH CAROLINA, Columbia, SC (US)

(72) Inventors: Guangxing Niu, West Columbia, SC (US); Bin Zhang, Irmo, SC (US)

(73) Assignee: UNIVERSITY OF SOUTH CAROLINA, Columbia, SC (US)

( * ) Notice: Subject to any disclaimer, the term of this patent is extended or adjusted under 35 U.S.C. 154(b) by 555 days.

(21) Appl. No.: 18/317,472

(22) Filed: May 15, 2023

(65) Prior Publication Data

US 2023/0375636 A1 Nov. 23, 2023

Related U.S. Application Data

(60) Provisional application No. 63/395,512, filed on Aug. 5, 2022, provisional application No. 63/344,358, filed on May 20, 2022.

(51) Int. Cl.

*G01R 31/392* (2019.01)
*G01R 31/36* (2020.01)
*G01R 31/367* (2019.01)

(52) U.S. Cl.

CPC ....... *G01R 31/392* (2019.01); *G01R 31/3648* (2013.01); *G01R 31/367* (2019.01)

(58) Field of Classification Search

CPC .............. G01R 31/392; G01R 31/3648; G01R 31/367; G06N 7/01; G06N 3/044; G06N 3/047

See application file for complete search history.

(56) References Cited

PUBLICATIONS

W. Yan et al., "Uncertainty Management in Lebesgue-Sampling-Based Diagnosis and Prognosis for Lithium-Ion Battery," in IEEE Transactions on Industrial Electronics, vol. 64, No. 10, pp. 8158-8166, Oct. 2017 (Year: 2017).*

(Continued)

*Primary Examiner* — Thomas K Pham

(74) *Attorney, Agent, or Firm* — DORITY & MANNING, P.A.

(57) ABSTRACT

Fault diagnosis and prognosis (FDP) is critical for ensuring system reliability and reducing operation and maintenance (O&M) costs. Lebesgue sampling based FDP (LS-FDP) is an event-based approach with the advantages of cost-efficiency, uncertainty management, and less computation. In previous works, LS-FDP approaches are mainly model-based. However, fault dynamic modeling is difficult and time consuming for some complex systems and this severely hinders the applications of LS-FDP. To address this problem, this present disclosure presents a data-driven based LS-FDP framework in which deep belief networks (DBN) and particle filter (PF) are integrated to achieve fault state estimation and remaining useful life (RUL) prediction. In the proposed approach, DBN learns the state evolution model and the Lebesgue time transition model, which are used as diagnostic and prognostic models in PF for FDP. The proposed approach has higher efficiency in terms of computation and better performance in terms of FDP accuracy and precision.

38 Claims, 15 Drawing Sheets

(56) References Cited

PUBLICATIONS

Chen et al. "Multisensor Feature Fusion for Bearing Fault Diagnosis Using Sparse Autoencoder and Deep Belief Network," IEEE Transactions on Instrumentation and Measurement, vol. 66, No. 7, pp. 1693-1702, 2017.
Chen et al. "Prediction of Machine Health Condition Using Neuro-Fuzzy and Bayesian Algorithms" IEEE Transactions on instrumentation and Measurement, vol. 61, No. 2, pp. 297-306, 2012.
Cui et al. "Fault Propagation Reasoning and Diagnosis for Computer Networks Using Cyclic Temporal Constraint Network Model," IEEE Transactions on Systems, Man, and Cybernetics: Systems, vol. 47, No. 8, pp. 1965-1978, 2016.
G. E. Hinton, "Deep belief networks," Scholarpedia, vol. 4, No. 5, p. 5947, 2009.
He et al. "Prognostics of lithium ion batteries based on Dempster-Shafer theory and the Bayesian Monte Carlo method," Journal of Power Sources, vol. 196, No. 23, pp. 10 314-10 321, 2011.
Jia et al. "Deep neural networks: A promising tool for fault characteristic mining and intelligent diagnosis of rotating machinery with massive data," Mechanical Systems and Signal Processing, vol. 72, pp. 303-315, 2016.
Lei et al. "Applications of machine learning to machine fault diagnosis: A review and roadmap," Mechanical Systems and Signal Processing, vol. 138, p. 106587, 2020.
Lei et al. "Machinery health prognostics: A systematic review from data acquisition to rul prediction," Mechanical systems and signal processing, vol. 104, pp. 799-834, 2018.
Li et al. "State-of-health estimation and remaining useful life prediction for the lithium-ion battery based on a variant long short term memory neural network," Journal of Power Sources, vol. 459, p. 228069, 2020.
Liu et al. "Bearing Fault Diagnosis Based on Improved Convolutional Deep Belief Network," applied sciences, vol. 10, No. 18, p. 6359, 2020.
Lyu et al. "Lebesgue-Time-Space Model-based Diagnosis and Prognosis for Multiple Mode Systems," IEEE Transactions on Industrial Electronics, vol. 68, No. 2, pp. 1591-1603. 2020.
Niu et al. "Fault Diagnosis and Prognosis Based on Deep Belief Network and Particle Filtering," in PHM Society Conference, vol. 10, No. 1, 2018.
Orchard et al. "A particle-filtering approach for on-line fault diagnosis and failure prognosis," Transactions of the Institute of Measurement and Control, vol. 31, No. 3-4, pp. 221-246, 2009.
Saxena et al. "Metrics for Offline evaluation of Prognostic Performance," International Journal of Prognostics and Health Management, vol. 1, No. 1, pp. 4-23, 2010.
She et al. "Battery Aging Assessment for Real-World Electric Buses Based on Incremental Capacity Analysis and Radial Basis Function Neural Network," IEEE Transactions on Industrial Informatics, vol. 16, No. 5, pp. 3345-3354, 2019.
Tamilselvan et al. "Failure diagnosis using deep belief learning based health state classification," Reliability Engineering & System Safety, vol. 115, pp. 124-135, 2013.
Wang et al. "A Novel Consistency Evaluation Method for Series-Connected Battery Systems Based on Real World Operation Data," IEEE Transactions on Transportation Electrification, 2020.
Wang et al. "Remaining Useful Life Prediction of Lithium-Ion Batteries Based on Spherical Cubature Particle Filter," IEEE Transactions on Instrumentation and Measurement, vol. 65, No. 6, pp. 1282-1291, 2016.
Wu et al. "A Weighted Deep Representation Learning Model for Imbalanced Fault Diagnosis in Cyber-Physical Systems." Sensors, vol. 18, No. 4, p. 1096, 2018.
Yan et al. "Lebesgue Sampling-Based Diagnosis and Prognosis for Lithium-Ion Batteries," IEEE Transactions on Industrial Electronics, vol. 63, No. 3, pp. 1804-1812, 2015.
Yan et al. "Low-Cost Adaptive Lebesgue Sampling Particle Filtering Approach for Real-Time Li-Ion Battery Diagnosis and Prognosis," IEEE Transactions on Automation Science and Engineering, vol. 14, No. 4, pp. 1601-1611. 2017.
Yang et al. "A comparative study of three model-based algorithms for estimating state-of-charge of lithium ion batteries under a new combined dynamic loading profile," Applied energy, vol. 164, pp. 387-399, 2016.
Yue et al. "Review on Health Conscious Energy Management Strategies for Fuel cell Hybrid Electric Vehicles: Degradation Models and Strategies," International Journal of Hydrogen Energy, vol. 44, No. 13, pp. 6844-6861, 2019.
Zhang et al. "An improved unscented particle filter approach for lithium-ion battery remaining useful life prediction," Microelectronics Reliability, vol. 81, pp. 288-298, 2018.
Zhang et al. "Battery heating for lithium-ion batteries based on multi-stage alternative currents," Journal of Energy Storage, vol. 32, p. 101885, 2020.
Zhang et al. "Cost-Effective Lebesgue Sampling Long Short-Term Memory Networks for Lithium-Ion Batteries Diagnosis and Prognosis," IEEE Transactions on Industrial Electronics, 2021.
Zhang et al. "Lebesgue Sampling-Based Diagnosis and Prognosis for Lithium-Ion Batteries." IEEE Transactions on Industrial Electronics, vol. 63, No. 3, pp. 1804-1812, 2016.
Zhang et al. "Lithium-Ion Battery Remaining Useful Life Prediction With Box-Cox Transformation and Monte Carlo Simulation," IEEE Transactions on Industrial Electronics, vol. 66, No. 2, pp. 1585-1597, 2019.
Zhang et al. "Nonlinear-Drifted Fractional Brownian Motion With Multiple Hidden State Variables for Remaining Useful Life Prediction of Lithium-Ion Batteries," IEEE Transactions on Reliability, vol. 69, No. 2, pp. 768-780, 2019.
Zhao et al. "Bearing Health Condition Prediction Using Deep Belief Network," in Proceedings of the Annual Conference of Prognostics and Health Management Society, Orlando, FL, USA, pp. 2-5, 2017.
Zhao et al. "Parallel computing method of deep belief networks and its application to traffic flow prediction," Knowledge-Based Systems, vol. 163, pp. 972-987, 2019.

* cited by examiner

Capacity
Time (Cycle)
Measurement
LBC state
$L_K + \varepsilon$
$L_K - \varepsilon$
$2\varepsilon$
Event checker at $L_{K+1}$
$L_{K+1} + \varepsilon$
$L_{K+1} - \varepsilon$
Lebesgue length
D

LEBESGUE SAMPLING-BASED DEEP BELIEF NETWORK FOR LITHIUM-ION BATTERY DIAGNOSIS AND PROGNOSIS

The present application claims the benefit of priority of U.S. Provisional Patent Application No. 63/344,358, titled Lebesgue Sampling-Based Deep Learning for Battery Diagnosis and Prognosis, filed May 20, 2022, and the benefit of priority of U.S. Provisional Patent Application No. 63/395,512, titled Lebesgue Sampling-Based Deep Belief Network for Lithium-Ion Battery Diagnosis and Prognosis, filed Aug. 5, 2022, and both of which are fully incorporated herein by reference for all purposes.

BACKGROUND OF THE PRESENTLY DISCLOSED SUBJECT MATTER

I. Introduction

Modern industrial systems are often operated under various stresses. With these stresses, faults may occur and lead to system damage, failures, or catastrophic events if they are not detected and corrective measures are not taken in time. Therefore, real-time fault diagnosis and prognosis (FDP) is critical for reliable and optimal system operation. In the past few decades, battery FDP and battery management techniques have achieved considerable achievements in academia and industries [1]-[6], with many successful applications [7]-[11]. For example, a novel cost-efficient Lebesgue sampling-based FDP (LS-FDP) framework is proposed in [6], which can greatly reduce the computation cost, and the proposed approach is successfully used for battery fault diagnosis and remaining useful life (RUL) prediction. To accommodate the nonlinear fault dynamics, an adaptive LS-FDP is further developed in [5] to improve the FDP efficiency. The proposed FDP approaches have been successfully applied to various industrial systems, such as batteries, bearings, electric vehicles, etc. Theoretically, the existing FDP approaches can be categorized as physical-model based and data-driven based [12], [13]. The physical-model based approaches typically describe the fault dynamic using comprehensive mathematical models, such as the accumulative damage model [14], fault propagation model [15], and failure physical model [16].

However, it is often challenging to model the fault degradation dynamics, especially for those complicated dynamics with different fault mechanisms, influencing factors [11], uncertainties, and strong nonlinearities. As a result, human involvement is often needed and it requires domain knowledge of system and fault dynamics, advanced signal processing techniques, and parameter identification techniques, which makes design complicated, ad-hoc, and with low generality.

Battery degradation shows regular patterns at fixed operating conditions in some traditional applications. In recent years, batteries are widely used in electronics and electric vehicles (EV). As a result, the battery application scenarios change a lot and batteries showing more dynamics due to the various charge and discharge operating conditions. The degradation of batteries is affected by various factors in the service life [17], such as charge-discharge cycles, depth of discharge (DOD), discharge current, operating temperature, cell inconsistency in series-connected battery systems [18], etc. The aging phenomenon of batteries shows more dynamic characteristics. Even the degradations of the batteries under constant operating conditions also show many characteristics, such as fluctuations, local peaks, etc. These characteristics can be caused by data collection noise, testing temperature, battery charge-discharge characteristics, battery recovery effects, variances in battery manufacturing, etc. Therefore, accurate and efficient modeling of the battery degradation is of great challenge and becomes more and more complex for batteries in modern applications.

Traditional degradation modeling methods have difficulties to capture this kind of characteristics and the FPD performance will be affected. On the contrary, deep learning techniques are powerful in learning these data characteristics and, therefore, are introduced for battery degradation modeling. Moreover, although the proposed FDP method is developed for batteries, it also explores and provides an effective FDP solution and can be easily expanded to many other industrial systems.

Recently, deep learning techniques, including Deep Belief Networks (DBNs), Long-Short Term Memory (LSTM), and Convolutional Neural Networks (CNNs), have achieved great successes in many fields, including FDP, which provide a solution to address the above-mentioned issues [19]-[21]. Each of these representative deep learning networks has its own unique advantages for different applications [22]. For example, CNN exhibits excellence in image processing tasks; LSTM is suitable in dealing with sequence processing tasks such as speech recognition due to its memory block structure; and DBN performs well in time series prediction, natural language processing, etc.

Although these deep learning algorithms have powerful feature extraction and learning abilities [23], [24], they are not capable of uncertainty management, which is critical in FDP, especially long-term prediction in prognosis. It is desirable to integrate deep learning based model with uncertainty management techniques to improve the FDP performance and capability. Among the three deep learning networks, DBN is developed earlier, has more applications [25], and has achieved great performance in terms of accuracy, stability, and practicality. For this reason, DBN is employed in this work to model the degradation behaviors of the batteries.

Moreover, traditional FDP algorithms are designed in Riemann sampling (RS) framework. In this RS-based FDP (RSFDP), algorithms are executed periodically when a new measurement (it is often the feature or the fault indicator extracted from raw data) becomes available. In practice, fault growth rate for many systems is slow, especially at the early stage of a fault. Consequently, the periodic execution of RS-FDP leads to heavy computation and high demand of computational resource. This causes difficulties in real-time applications, especially those distributed ones, where FDP algorithms are deployed on portable devices or embedded systems that have only limited computation and storage capabilities. Besides, the traditional RS-based methods usually have a large prediction horizon, which will increase prediction uncertainty and affect FDP performance.

To address this issue, a novel Lebesgue sampling based FDP (LS-FDP) framework was proposed [6]. LS-FDP is an event-based FDP approach, in which the algorithm is triggered when an event (the fault state change from the current Lebesgue state to another one) occurs. In this design, some unnecessary executions, especially when the fault degradation rate is slow, can be avoided. Meanwhile, the prognosis uncertainty will also be reduced with the reduction of the prediction horizon. In the existing works, LS-FDP are based on simple empirical fault dynamic model, which is insufficient for data analysis, feature extraction, and complicated dynamic model. This hinders the application of LS-FDP in complex systems.

Summary of the Presently Disclosed Subject Matter

Aspects and advantages of the presently disclosed subject matter will be set forth in part in the following description, or may be apparent from the description, or may be learned through practice of the presently disclosed subject matter.

Broadly speaking, the presently disclosed subject matter proposes a LS-FDP framework that integrates the automatic learning capability of deep learning techniques and uncertainty management capability of Bayesian estimation to address their individual limitations. With the integration of DBN for data processing and modeling and particle filter (PF) for Bayesian estimation in Lebesgue sampling (LS), the proposed approach is able to improve the prediction accuracy, provide uncertainty representation and management for fault state and RUL, and reduce the computation for real-time applications. The main contributions are three-fold: 1). Integrate DBN and PF-based FDP in the LS framework to improve the computational efficiency, accuracy, and extensibility of FDP approaches; 2). Study the design and implementation of uncertainty management of Monte Carlo method for modeling with deep learning techniques; and 3). Verify the effectiveness of the proposed approach with the implementation of offline and online experiments on lithium-ion batteries.

Another presently disclosed broader object is generally directed to a system that includes development of an algorithm and verification of a method of the application of a battery under different real operating conditions. Presently disclosed technology in some instances may include Lebesgue Sampling fault diagnosis and prognosis (LS-FDP) framework that integrates the automatic learning capability of deep learning techniques and uncertainty management capability of Bayesian estimation to address their individual limitations.

Still further, presently disclosed subject matter in part may relate to improvement in the state of the art for Deep Belief Networks, Lebesgue sampling, particle filtering, fault dynamic model, and Lithium-ion battery evaluations.

Other example aspects of the present disclosure are directed to systems, apparatus, tangible, non-transitory computer-readable media, user interfaces, memory devices, and electronic smart devices or the like. To implement methodology and technology herewith, one or more processors may be provided, programmed to perform the steps and functions as called for by the presently disclosed subject matter, as will be understood by those of ordinary skill in the art.

One exemplary embodiment of presently disclosed subject matter relates to a method for performing diagnosis and prognosis for lithium-ion batteries which integrates deep learning based models with uncertainty management techniques. Such method preferably comprises training a machine-learned Lebesgue sampling (LS) deep belief network (DBN)-based fault state model to identify and estimate a fault state distribution at an event time for a target battery based on training data associated with at least one training lithium-ion battery; and training a machine-learned Lebesgue sampling (LS) deep belief network (DBN)-based Lebesgue time model to directly predict the operation time for the fault state to reach pre-defined Lebesgue states based on training data associated with at least one training lithium-ion battery and the fault state distribution at an event time. Such method preferably further comprises obtaining test data associated with a target battery; inputting the test data into the machine-learned fault state model; inputting the test data into the machine-learned Lebesgue time model; and receiving, as outputs of the models, diagnosis of the target battery's state distribution and prognosis of the target battery's remaining useful life (RUL) distribution, respectively.

Yet another exemplary embodiment of presently disclosed subject matter relates to a method for performing state-of-charge (SOC) diagnosis and prognosis for lithium-ion batteries which integrates deep belief networks for data processing and modeling with particle filtering (PF) for Bayesian estimation in Lebesgue sampling (LS) for uncertainty management. Such method preferably comprises: training a machine-learned Lebesgue sampling (LS) deep belief network (DBN)-based fault state model to identify and estimate a fault state distribution at an event time for a target battery based on training data associated with a plurality of training lithium-ion batteries; training a machine-learned Lebesgue sampling (LS) deep belief network (DBN)-based Lebesgue time model to directly predict the operation time for the fault state to reach pre-defined Lebesgue states based on training data associated with a plurality of training lithium-ion batteries and the fault state distribution at an event time; obtaining test data associated with a target battery; inputting the test data into the machine-learned fault state model; inputting the test data into the machine-learned Lebesgue time model; and receiving, as outputs of the models, diagnosis of the target battery's state distribution and prognosis of the target battery's remaining useful life (RUL) distribution, respectively, using respective different models.

It is to be understood from the complete disclosure herewith that the presently disclosed subject matter equally relates to both apparatus and corresponding and related methodology.

An exemplary embodiment of a presently disclosed system according to presently disclosed subject matter relates to a system for performing battery diagnosis and prognosis for lithium-ion batteries. Such system preferably comprises a machine-learned Lebesgue sampling (LS) deep belief network (DBN)-based fault state model trained to identify and estimate a fault state distribution at an event time for a target battery based on training data associated with at least one training lithium-ion battery; a machine-learned Lebesgue sampling (LS) deep belief network (DBN)-based Lebesgue time model trained to directly predict the operation time for the fault state to reach pre-defined Lebesgue states based on training data associated with at least one training lithium-ion battery and the fault state distribution at an event time; one or more processors; and one or more non-transitory computer-readable media that store instructions that, when executed by the one or more processors, cause the one or more processors to perform operations. Such operations preferably comprise obtaining test data associated with a target battery; inputting the test data into the machine-learned fault state model; inputting the test data into the machine-learned Lebesgue time model; and receiving, as outputs of the models, diagnosis of the target battery's state distribution and prognosis of the target battery's remaining useful life (RUL) distribution, respectively.

Additional objects and advantages of the presently disclosed subject matter are set forth in, or will be apparent to, those of ordinary skill in the art from the detailed description herein. Also, it should be further appreciated that modifications and variations to the specifically illustrated, referred and discussed features, elements, and steps hereof may be practiced in various embodiments, uses, and practices of the presently disclosed subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the presently disclosed subject matter may include various combinations or configurations of presently disclosed features, steps, or elements, or their equivalents (including combinations of features, parts, or steps or configurations thereof not expressly shown in the Figures or stated in the detailed description of such Figures). Additional embodiments of the presently disclosed subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification, and will appreciate that the presently disclosed subject matter applies equally to corresponding methodologies as associated with practice of any of the present exemplary devices, and vice versa.

BRIEF DESCRIPTION OF THE FIGURES

A full and enabling disclosure of the presently disclosed subject matter, including the best mode thereof, directed to one of ordinary skill in the art, is set forth in the specification, which makes reference to the appended Figures, in which:

FIG. 11(*b*) graphically illustrates exemplary modeling performance of the presently disclosed DBN trained prognostic Lebesgue time model (LTM);

FIG. 12(*b*) graphically illustrates exemplary comparison of presently disclosed estimated current state capacity estimation distribution with the baseline capacity distribution, in relation to the subject matter of FIG. 12(*a*);

FIG. 15(*e*) graphically illustrates an oriented coordinate system for FIGS. 15(*a*) through 15(*d*), with the X-axes of such FIGS. representing different FDP methods, the Y-axes different batteries, and the Z-axes different evaluation metrics;

FIG. 19(*b*) graphically illustrates exemplary comparison of presently disclosed estimated current state capacity estimation distribution with the baseline capacity distribution, in relation to the subject matter of FIG. 19(*a*);

Figures 1, 2:
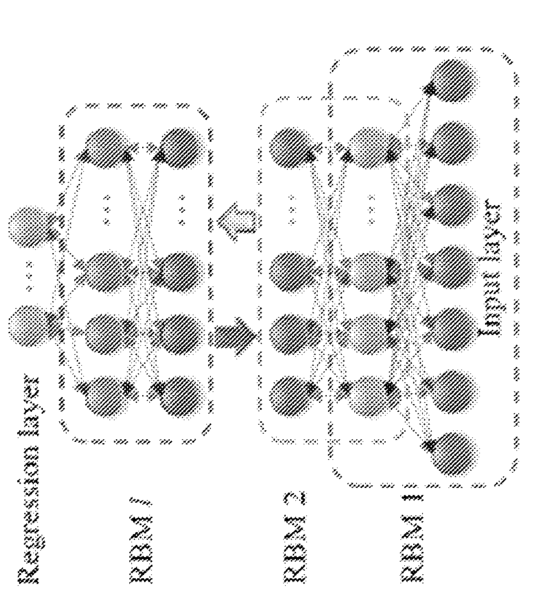
FIG. 1 illustrates an exemplary diagram of architecture of a deep belief network (DBN)
FIG. 2 illustrates a graph representing corresponding time distribution of each Lebesgue state, in conjunction with Lebesgue time measurement methodology presently disclosed.

Repeat use of reference characters in the present specification and drawings is intended to represent the same or analogous features or elements or steps of the presently disclosed subject matter.

DETAILED DESCRIPTION OF THE PRESENTLY DISCLOSED SUBJECT MATTER

It is to be understood by one of ordinary skill in the art that the present disclosure is a description of exemplary embodiments only, and is not intended as limiting the broader aspects of the disclosed subject matter. Each example is provided by way of explanation of the presently disclosed subject matter, not limitation of the presently disclosed subject matter. In fact, it will be apparent to those skilled in the art that various modifications and variations can be made in the presently disclosed subject matter without departing from the scope or spirit of the presently disclosed subject matter. For instance, features illustrated or described as part of one embodiment can be used with another embodiment to yield a still further embodiment. Thus, it is intended that the presently disclosed subject matter covers such modifications and variations as come within the scope of the appended claims and their equivalents.

The present disclosure is generally directed to a system that includes development of an algorithm and verification of a method of the application of a battery under different real operating conditions. The method includes Lebesgue Sampling fault diagnosis and prognosis (LS-FDP) framework that integrates the automatic learning capability of deep learning techniques and uncertainty management capability of Bayesian estimation to address their individual limitations.

Some embodiments may include integrating DBN- and Particle Filter-based fault diagnosis and prognosis in the Lebesgue Sampling framework to improve the computational efficiency, accuracy, and extensibility of FDP approaches by studying the design and implementation of uncertainty management of the Monte Carlo method for modeling with deep learning techniques.

Further, the effectiveness of this method can be verified with the application of offline and online experiments on lithium-ion batteries.

This method can be used for a variety of applications including, but not limited to, using deep learning algorithms to model battery degradation. Battery diagnosis and prognosis is a critical technique, which can provide accurate state estimation and remaining life prediction. It presents a data driven-based FDP method, which is able to improve the prediction accuracy, and to provide uncertainty, representation and management for fault state and RUL, and to reduce the computation for real-time applications. This system is especially suitable for real-time applications, where FDP algorithms are deployed on portable devices or embedded systems that have only limited computation and storage capabilities, and therefore, has great application prospects.

Accurate and efficient modeling of battery degradation is one of the greater challenges powering our system, especially as the degradation of batteries in modern applications becomes more and more complex. However, deep learning techniques utilized by us are powerful tools for learning the data characteristics needed for battery degradation modeling.

Deep learning algorithms have powerful feature extraction and learning abilities; however, they are not capable of uncertainty management, which is critical in FDP, especially for long-term prediction in prognosis. Among the three deep learning networks, DBN was developed earlier, has more applications, and has achieved great performance in terms of accuracy, stability, and practicality. For this reason, DBN is employed in this work to model the degradation behaviors of the batteries.

Moreover, traditional FDP algorithms are designed in the Riemann sampling (RS) framework. In this RS-based FDP (RS-FDP), algorithms are executed periodically when a new measurement becomes available. In practice, the fault growth rate for many systems is slow, especially at the early stage of a fault. Consequently, the periodic execution of RS-FDP leads to heavy computation and high demand for computational resources. This causes difficulties in real-time applications, especially those distributed ones, where FDP algorithms are deployed on portable devices or embedded systems that have only limited computation and storage capabilities. Further, the traditional RS-based methods usually have a large prediction horizon, which will increase prediction uncertainty and affect FDP performance.

Currently, our system can be used for battery diagnosis and prognosis for lithium-ion batteries. Lithium-ion batteries are widely used in different applications, such as cell phones, laptops, electric vehicles, watches, etc. The global lithium-ion battery market was valued $36.7 billion in 2019, and is projected to hit $129.3 billion by 2027, at a GAGR of 18% from 2020 to 2027. The lithium-ion battery market is highly driven by the increasing development of electric vehicles in recent years.

II. Theory of the Proposed Approach

A. Deep Belief Networks

DBNs have deep architectures containing multiple Restricted Boltzmann Machines (RBMs), which consist of a hidden layer and a visible layer to conduct a nonlinear transformation from the previous layer to the next layer. For the DBN structure shown in FIG. 1, the output of the previous RBM is the input of the next RBM.

RBM is a special probabilistic model of Boltzmann machine [27], [28]. By defining v and h as the visible input vector and hidden vector, respectively, the energy function of RBM is:

$$E(v, h) = -\sum_{j=1}^{m} v_j \cdot a_j - \sum_{i=1}^{n} h_j \cdot b_i - \sum_{i=1}^{n}\sum_{j=1}^{m} v_j \cdot w_{ij} \cdot h_i \tag{1}$$

where $a_i$ and $b_j$ are the bias terms of the visible node i and the hidden node j respectively, $w_{ij}$ is the weight of the connection between the nodes i and j.

The joint probability over (v, h) can be obtained by:

$$p(v, h) = \frac{1}{Z} e^{-E(v,h)};\ Z = \sum_{v,h} e^{-(v,h)} \tag{2}$$

where Z is the partition function given by the sum of the energy of all possible configurations.

Given a random visible vector v, the conditional probability of the hidden unit with binary value of 1 is:

$$p(h_i = 1 \mid v) = \frac{1}{1 + e^{-b_i - \sum_{i=1}^{m} v_i w_{ij}}} \tag{3}$$

Similarly, given a random hidden vector h, the conditional probability of the visible unit with binary value of 1 is:

$$p(v_i = 1 \mid h) = \frac{1}{1 + e^{-a_i - \sum_{j=1}^{m} h_j w_{ij}}} \tag{4}$$

B. LS-based diagnostic and prognostic model

In the traditional RS-FDP framework, FDP algorithm is executed at the time instants $\{t_1, t_2, t_3, \ldots, t_k\}$ determined by the system sampling rate or feature extraction rate. This strategy does not consider the fault degradation speed in which the algorithm is executed periodically no matter if the fault state change is small or large. In RS-FDP, diagnosis and prognosis use the same model. RS-based diagnosis is to estimate the current fault state distribution using the model and the previous estimated state. RS-based prognosis is to recursively predict the fault states of future time instants, which are compared with the failure threshold to obtain the time to failure (TTF).

In the LS-FDP framework, the fault space is partitioned into some pre-defined Lebesgue states $\{F_1, F_2, F_3, \ldots, F\}$ with a constant or variable Lebesgue length D. As mentioned earlier, LS-FDP is an event-based approach, in which events are defined as changes of fault state among Lebesgue states. The diagnostic algorithm is executed when an event happens. LS-based diagnosis uses a fault state model and estimates the fault state distribution at the event time. LS-based prognosis, on the other hand, uses a Lebesgue time model and directly predicts the operation time for the fault state reaching the pre-defined Lebesgue states. The TTF is estimated on the Lebesgue state defined on the failure threshold.

Above discussion shows that LS-FDP uses different models in diagnosis and prognosis. The two models, the state space model and Lebesgue-time model, are discussed as follows.

1) State space model: The fault growth dynamics can be generally described as:

$$x_k = f(x_{k-1}, D, \omega_k) \tag{5a}$$

$$z_k = h(x_k, v_k) \tag{5b}$$

where k is event stamp, x is the system state, f(·) depicts the system state transition regularity, Ok is the process noise, h(·) is the measurement equation, z is the state measurement, and $v_k$ is the measurement noise.

For battery capacity degradation application, the capacity is directly used as measurement z. In LS-DBN based FDP, the state transition model is used in the diagnosis process to estimate the current fault state. This is similar to the state model in RS-based approaches.

2) Lebesgue-time space model: Different from RS-based prognosis, LS-based prognosis uses a Lebesgue time model (LTM) to directly predict the operating time distribution for fault state reaching Lebesgue states. The LTM is described as:

$$t(L_{k+1}) = g(L_k, t(L_k), D) + \omega_t(L_k) \tag{6}$$

where g(·) is the time transition function that describes the time evolution for fault reaching Lebesgue state, $L_k$ and $L_{k+1}$ are the two adjacent Lebesgue states, D is the Lebesgue length, and $\omega_t$ is the process noise in the time transition process.

Figures 3, 4:
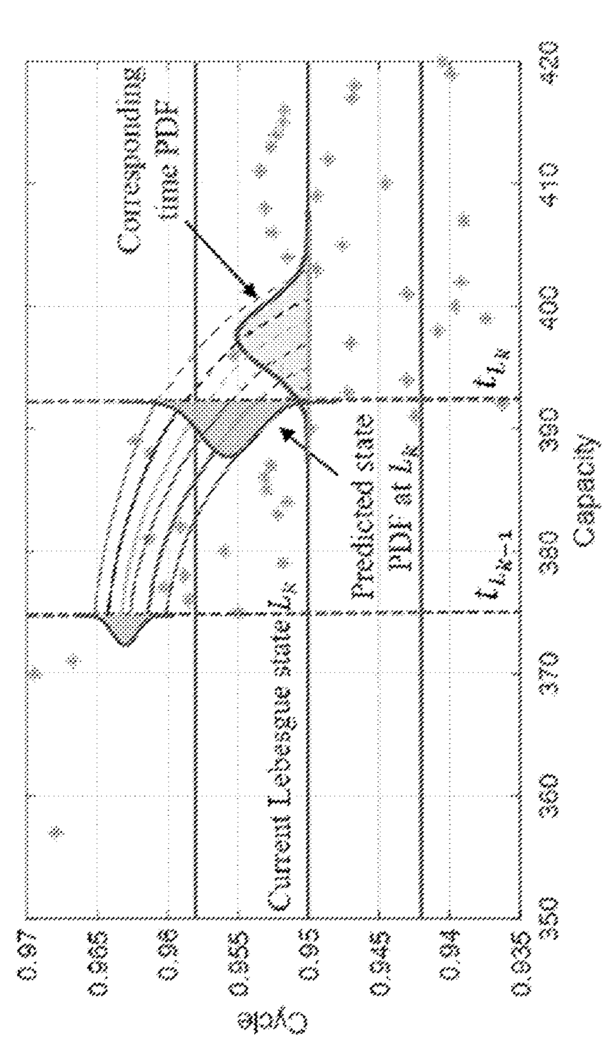
FIG. 3 graphically illustrates a Lebesgue time transition curve.
FIG. 4 graphically illustrates a presently disclosed conversion process between time distribution and state distribution.

LTM plays an important role in LS-based prognosis. Due to the capacity measurement noise and battery degradation characteristics, it is impossible to get an exact corresponding Lebesgue time for each Lebesgue state. To build this model from measurements, a two-side checker, which is a neighboring range centered at a Lebesgue state [29], is defined for each Lebesgue state to identify the time measurements. For Lebesgue state $L_k$, the two-side checker is defined by the parameter $\varepsilon(\varepsilon<D/2)$ as $[L_k-\varepsilon, L_k+\varepsilon]$ as shown in FIG. 2. The measurements that fall into the $[L_k-\varepsilon, L_k+\varepsilon]$ are identified and recorded as samples of Lebesgue state $L_k$. The mean and variance of the recorded measurements are used as the distribution of corresponding time measurement $T_k$ for $L_k$. The parameter & should be set based on the measurement noise to provide a reasonable and accurate estimation for the Lebesgue time model. Based on this strategy, the time transition curve can be obtained, as shown in FIG. 3, which is then trained by DBN for LTM modeling.

Note that two models are trained in LS-FDP for diagnosis and prognosis, respectively. For the diagnostic model, the input is a vector of fault state and the output is the state at the time of a Lebesgue event. For prognostic model, the input is a vector of time measurement for fault state reaching previous Lebesgue states, the output is the operating time for the fault reaching the next Lebesgue state.

C. LS-based FDP using PF

Diagnosis and prognosis aim at estimating the current state and predicting the TTF. Bayesian estimation techniques provide a general rigorous solution for dynamic fault state estimation and prediction problems.

Mathematically, fault state X can be described by a Markov process characterized by the initial distribution $p(x_0)$ and the transition probability $p(x_k|x_{k-1})$ defined in Eq. (5a). Define $x_{0:k}=\{x_0, \ldots, x_k\}$ and/1: k=$\{y_1, \ldots, y_k\}$ as the state and measurement up to the kth Lebesgue event. It is of interest to estimate the posterior distribution $p(x_{0:k}|y_{1:k})$. Based on the Bayesian estimation theory, the task involves two steps, i.e., prediction and filtering.

The prediction process is defined as:

$$p(x_{0:k}|y_{1:k-1}) = \int p(x_k|x_{0:k-1})p(x_{0:k-1}|y_{1:k-1})dx_{0:k-1} \tag{7}$$

where $p(x_{k-1}|y_{1:k-1})$ is the marginal distribution.

The filtering step is conducted with a new measurement to get the posterior probability distribution $p(_{0:k}|y_{1:k})$, which is given as:

$$p(x_{0:k} \mid y_{1:k}) = \frac{p(y_k \mid x_k)p(x_k \mid y_{1:k-1})}{p(y_k \mid y_{1:k-1})} \tag{8}$$

Since many systems are nonlinear or non-Gaussian, a Sequential Monte Carlo (SMC) method, also known as particle filter, is used to approximate the optimal solution. In LS, FDP algorithm is only executed at the transition of Lebesgue states. Firstly, a set of N particles $$\{x^i_{0:k-1}, w^i_{k-1}\},$$

i=1;2; . . . N is assumed available at the (k−1)th Lebesgue event, where $$x^i_{0:k-1}$$

define the locations of particles in the fault state space and $$w^i_k$$

are the weights of particles with the sum of 1. The particles can be used to approximate the desired state distribution $\psi_{k-1}(x_{0:k-1})$. The objective is to approximate the state distribution $\psi_k(x_{0:k})$ using the obtained new set of particles $$\{\hat{x}^i_{0:k}, w^i_k\}$$

as:

$$\psi_k(x_{0:k}) \approx p_N(x_k \mid y_{1:k}) = \sum_{i=1}^{N} w_k^i \delta\left(x_{0:k} - \hat{x}_{0:k}^i\right) \tag{9}$$

where δ is the Dirac-delta function.

The weights of new particles can be obtained as:

$$w(\hat{x}_{0:k}^i) = w_{k-1}^i h\left(y_{1:k} \mid x_{0:k}^i\right);\ w_k^i = \frac{w(\hat{x}_{0:k}^i)}{\sum_{i=1}^{N} w(\hat{x}_{0:k}^i)} \tag{10}$$

where $f_{DBN}$ is the trained state space model using DBN and $\omega_k$ is the noise term to the model.

In LS-based diagnosis, the algorithm is executed only when the measurement causes the transition of Lebesgue state, which is still executed over time to estimate the state but not periodically. On the contrary, LS-based prognosis is executed over Lebesgue state to predict the time for fault reaching each Lebesgue state from the current state. The output from diagnosis is the state distribution in the current Lebesgue state while the input to prognosis is the time distributions on the current Lebesgue state. Therefore, the time distribution of the current Lebesgue state needs to be calculated from the state distribution [6]. The converted time distribution is then used as the initial condition for LS-based prognosis.

Assume that the estimated state distribution in diagnosis is represented as $$p\left(x_t^{L_k}\right),$$

$L_k$ is the corresponding Lebesgue state at time instant $t_{Lk}$. With the particles in diagnosis, the time distribution of the current Lebesgue state can be approximated. In FIG. 4, since the state distribution at the current time instant $t_{Lk}$ is approximated using particles, some particles do not reach the Lebesgue state $L_k$. For those particles, a short prediction is conducted to predict the time instants for the particles reaching the Lebesgue state $L_k$ [6]. Since the state distribution at $t_{Lk}$ is obtained from diagnosis, based on the trained DBN based diagnostic model, the prediction is continuously executed until all the particles reach the current Lebesgue state $L_k$. In this process, the time instants of the particles reaching the current Lebesgue state $L_k$ are recorded. Then the time distribution of $L_k$ can be approximated using the recorded particles. FIG. 4 shows the conversion process between time distribution and state distribution. After the Lebesgue time distribution is obtained, the prognostic can be conducted over the Lebesgue state.

In LS-based prognosis, the prognosis algorithm predicts the time distribution directly. Based on the estimated fault states and current Lebesgue state, the distribution of the operating time for the state reaching each future Lebesgue state can be predicted by the prognostic model given in Eq. (6).

With the prognostic model, n particles $$\left\{\left(t_{L_k}^i, w_{L_k}^i\right), \left(t_{L_{k-1}}^i, w_{L_{k-1}}^i\right), \ldots, \left(t_{L_{k-n}}^i, w_{L_{k-n}}^i\right)\right\}$$

are established from the estimated state, where n=4 defines the input size of the model, $$w_{L_k}^i$$

is the particle weight, and $$t_{L_k}^i$$

is the particle location on the time axis. Since there is no measurement available in this process, the prognosis is an iterative prediction process. The prediction steps are $[L_{k+1}, L_{k+2}, \ldots, L_f]$, where $L_f$ denotes the failure Lebesgue state, and the expectations of the prognosis are the operating time distribution for the fault reaching the Lebesgue states. The output can be denoted as $[t(L_{k+1}), t(L_{k+2}), \ldots, (L_f)]$. In LS-based prognosis, the RUL pdf is predicted directly at the failure Lebesgue state $L_f$.

III. Implementation of the Proposed Algorithm

Figures 5, 6:
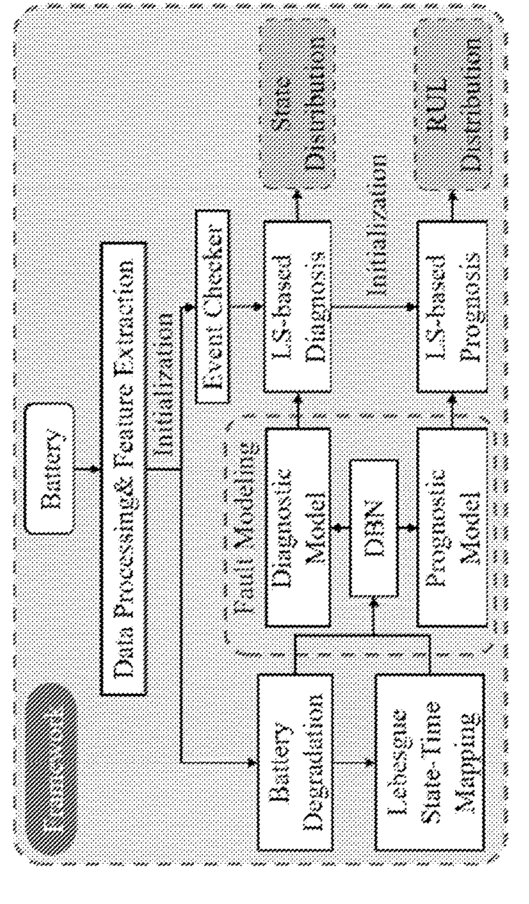
FIG. 5 schematically illustrates exemplary implementation of presently disclosed Lebesgue sampling based DBN FDP (LS-DBN-FDP) subject matter with an application to the degradation of state-of-health (SOH) of lithium-ion batteries.
FIG. 6 graphically illustrates presently disclosed exemplary event checkers in an exemplary battery SOH degradation case.

FIG. 5 outlines the implementation procedures of the proposed Lebesgue sampling based DBN FDP (LS-DBN-FDP) approach with an application to the degradation of state-of-health (SOH) of lithium-ion batteries. The implementation consists of time measurement, LS-based fault dynamic modeling, LTM modeling, and FDP algorithm.

DBN based LS-FDP is an event-trigger based approach. FIG. 6 illustrates event checkers in a battery SOH degradation case, in which the upper boundary of the checker is used as the trigger (the magenta line). Once the measurement falls below the checker, the diagnosis algorithm will be triggered [29].

Figure 7:
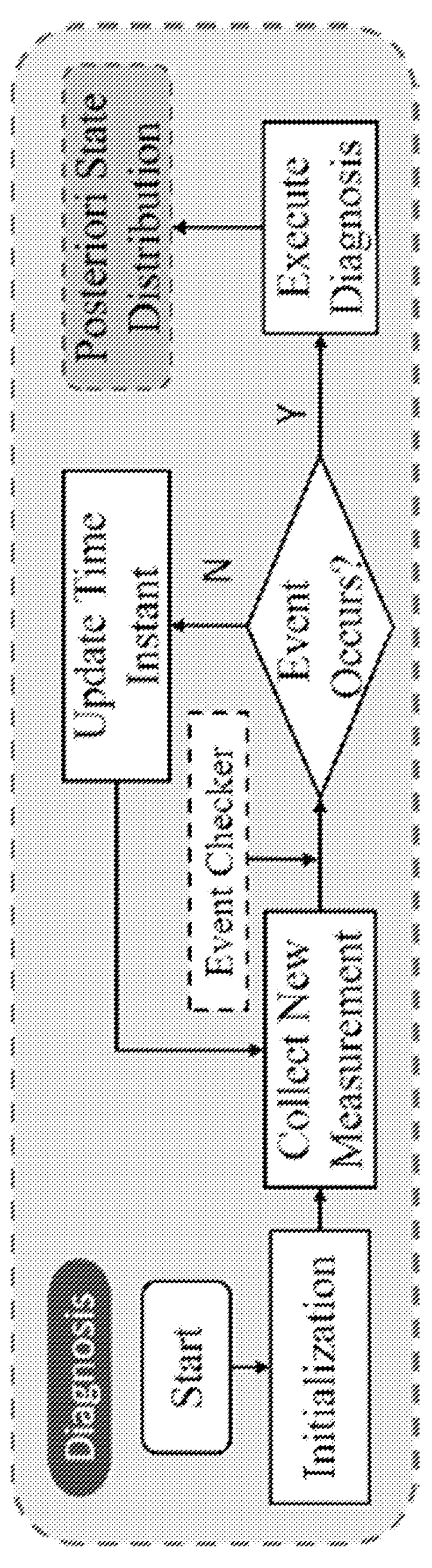
FIG. 7 illustrates a flowchart of exemplary implementation of presently disclosed LS-DBN based diagnosis procedure.

FIG. 7 shows the diagnostic algorithm implementation procedure. When the measurement becomes available at each time instant (sampling time), the event checker checks if an event occurs. If yes, the diagnosis algorithm is executed to update the fault state. If not, it indicates that the fault state does not have much change and the diagnostic algorithm is not executed.

Figure 8:
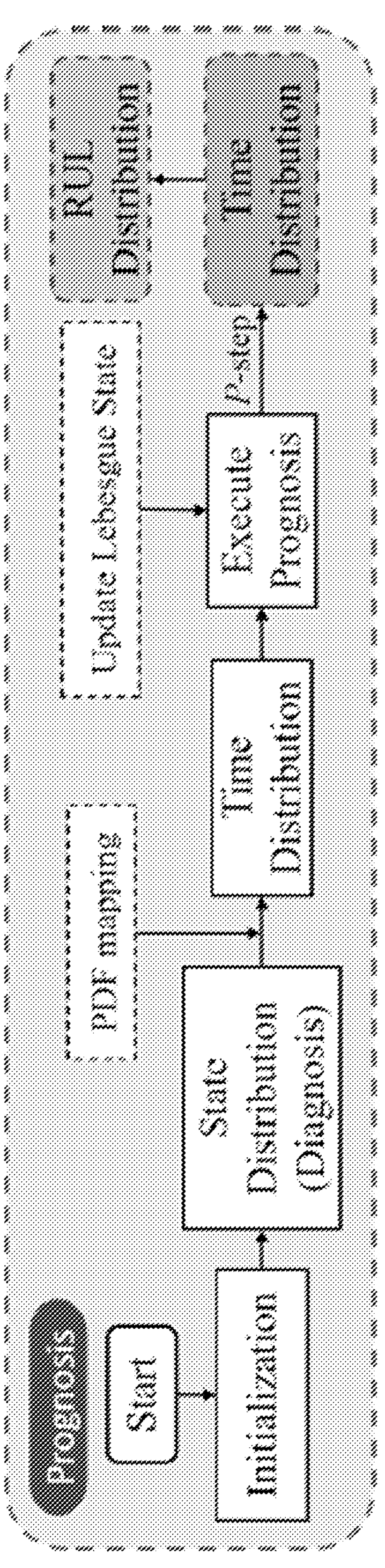
FIG. 8 illustrates a flowchart of exemplary implementation of presently disclosed LS-DBN based prognosis procedure.

FIG. 8 shows the prognostic algorithm implementation procedure. In prognosis, the fault state distribution is converted into the time distribution on the current Lebesgue state, which is used as the initial condition in prognosis. Then, the corresponding time distributions for all future Lebesgue states are predicted recursively. The TTF distribution is obtained on the Lebesgue state defined on the failure threshold.

The details of the implementation procedures are as follows:

Step 1: Initialization and data preparation: Define Lebesgue states and build the LS-based fault dynamic model using DBN training. This model is used in LS-based diagnosis.

Step 2: Define two-side measurement checkers and extract the time measurements for Lebesgue states. Use DBN to train the LTM based on the time measurements. This model is used in LS-based prognosis.

Step 3: LS-based diagnosis: Collect measurement and use the event checker to check if an event occurs. If yes, run diagnosis to estimate the current state. Then, this distribution is compared against the baseline distribution (defined when the system is in health condition) for fault detection.

Step 4: LS-based prognosis: After a fault is detected, the fault state distribution is converted into time distribution, which is used as the initial condition, along with LTM, to predict the time for fault state reaching the Lebesgue states. TTF is the time distribution for the Lebesgue state defined on the failure threshold.

IV. Experiments and Analysis

This section demonstrates the effectiveness of the proposed method with a series of applications to the state-of-health (SOH) of lithium-ion batteries. The experiments are implemented in MATLAB R2020a environment running on a computer with Intel (R) Core (TM) i7-6700 CPU @ 3.40 GHz (8CPUs) processor, 3.4 GHz 16G RAM.

A. Offline Experiments

Figure 9:
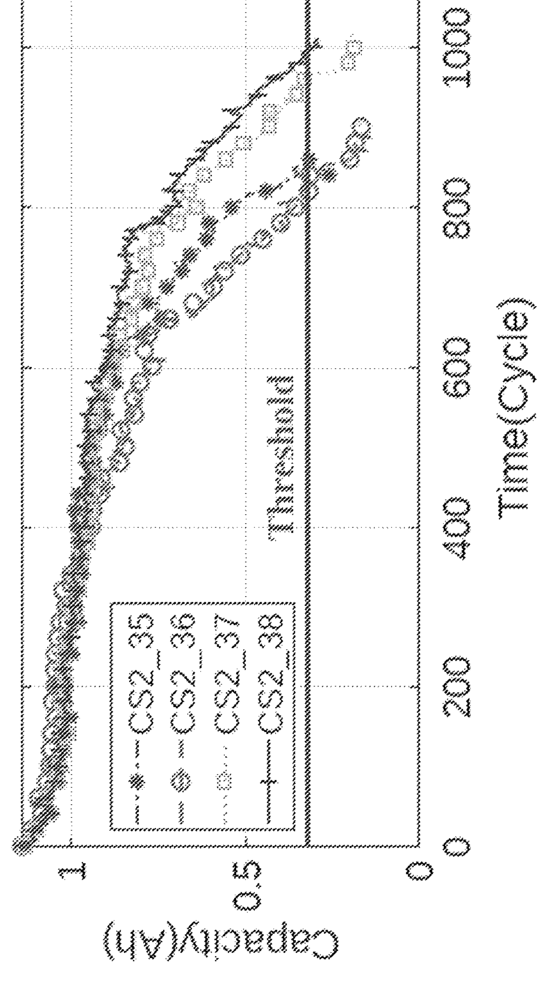
FIG. 9 graphically illustrates exemplary Li-ion battery degradation data.
Figure 10:
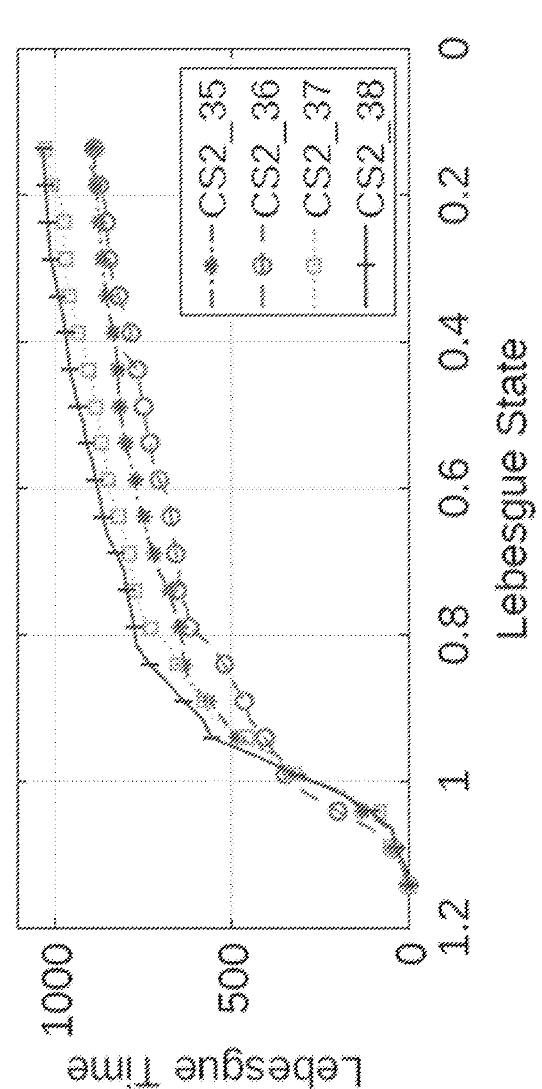
FIG. 10 graphically illustrates exemplary extracted Lebesgue time measurement transition curves.

FIG. 9 shows the capacity degradation of 4 lithium-ion batteries with a rated capacity of 1.1 Ah, which are obtained from charge-discharge tests using a BT2000 battery testing system [31]. The failure threshold is defined as 0.32 Ah. The parameter E of the width event checker is 0.005. The Lebesgue length is set as 0.025 in the battery capacity range and this results in 32 Lebesgue states. FIG. 10 shows the Lebesgue time transition curves, which are extracted from the capacity degradation process based on the Lebesgue time measurement method described in FIG. 2.

Figure 11A:
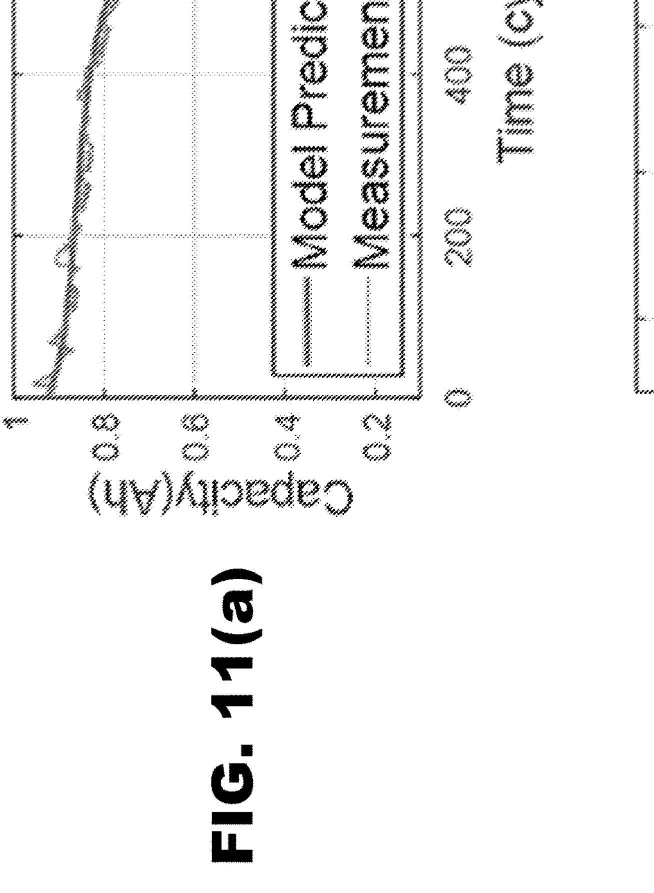
FIG. 11(*a*) graphically illustrates exemplary modeling performance of the presently disclosed diagnostic model.
Figure 11B:
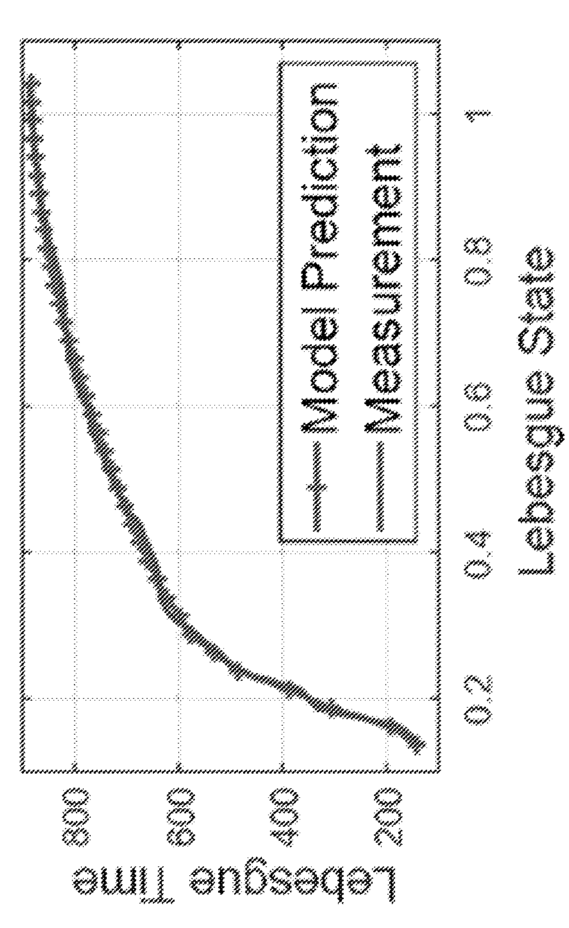

1) DBN based modeling: As mentioned early, diagnosis uses a fault dynamic model to estimate the fault state. For this model, the battery aging data is used directly to construct the input and output for DBN. DBN is performed on capacity data shown in FIG. 9 to find a representative aging model. FIG. 11(*a*) shows the modeling performance of the diagnostic model, which is trained from three batteries and shown with the remaining battery for verification. It is clear that the DBN-based fault dynamic model can capture the battery capacity degradation trend. The diagnostic fault model is described as:

$$\hat{x}_k^L = f_{DBN}(x_{k-1}, x_{k-2}, \ldots, x_{k-m}) + \omega(t_k) \quad (12)$$

where $f_{DBN}$ is the trained DBN based diagnostic model, $t_k$ is the event time stamp, ω is the model noise.

The LS-based prognosis uses LTM, which is trained from the extracted time transition curves shown in FIG. 10, to predict the TTF. FIG. 11(*b*) shows the DBN trained prognostic LTM, which is trained from three batteries and tested with the fourth battery. Obviously, the model is accurate to describe the fault dynamics. The model can be described as:

$$\hat{t}_L = g_{DBN}(t_{L-1}, t_{L-2}, \ldots, x_{L-n}) + \omega_L \quad (13)$$

where $g_{DBN}$ is the trained LTM, $\hat{t}_L$ is the predicted time instant for the Lebesgue state L, and $\omega_L$ is the model noise.

2) Fault diagnosis and prognosis: In this experiment, each of the four batteries is used in the leave-one-out cross-validation. In each validation, three batteries are used as the training data and the remaining one is for validation. Therefore, 4 sets of DBN based diagnostic and prognostic models are used for different batteries. The training algorithm is the Conjugate Gradient. To save space, only the diagnosis and prognosis details of battery CS2_35 is shown in detail here. The main parameters and structures of DBN based diagnostic and prognostic models are shown in Table I. The cost function and fine-tuning method of DBN training are Mean Squared Error (MSE) and three-term conjugate gradient (CG), respectively. It can be clearly found that both models can describe the measurement well, the root mean square error (RMSE) of the diagnostic model and prognostic model are 0.0199 and 10.2728 respectively.

TABLE I

PARAMETERS OF DBN MODEL

| Parameter description | Diagnostic | Prognostic |
|---|---|---|
| The unit number of input layer | 35 | 5 |
| The number of RBM | 2 | 2 |
| The unit number of hidden layer1 | 60 | 40 |
| The unit number of hidden layer2 | 10 | 15 |
| Learning rate of RBM | 0.1 | 0.1 |
| Initial momentum of RBM | 0.5 | 0.5 |
| Iterations of each RBM | 100 | 100 |
| Iteration of conjugate gradient | 0.5 | 0.5 |

Figures 12A, 12B:
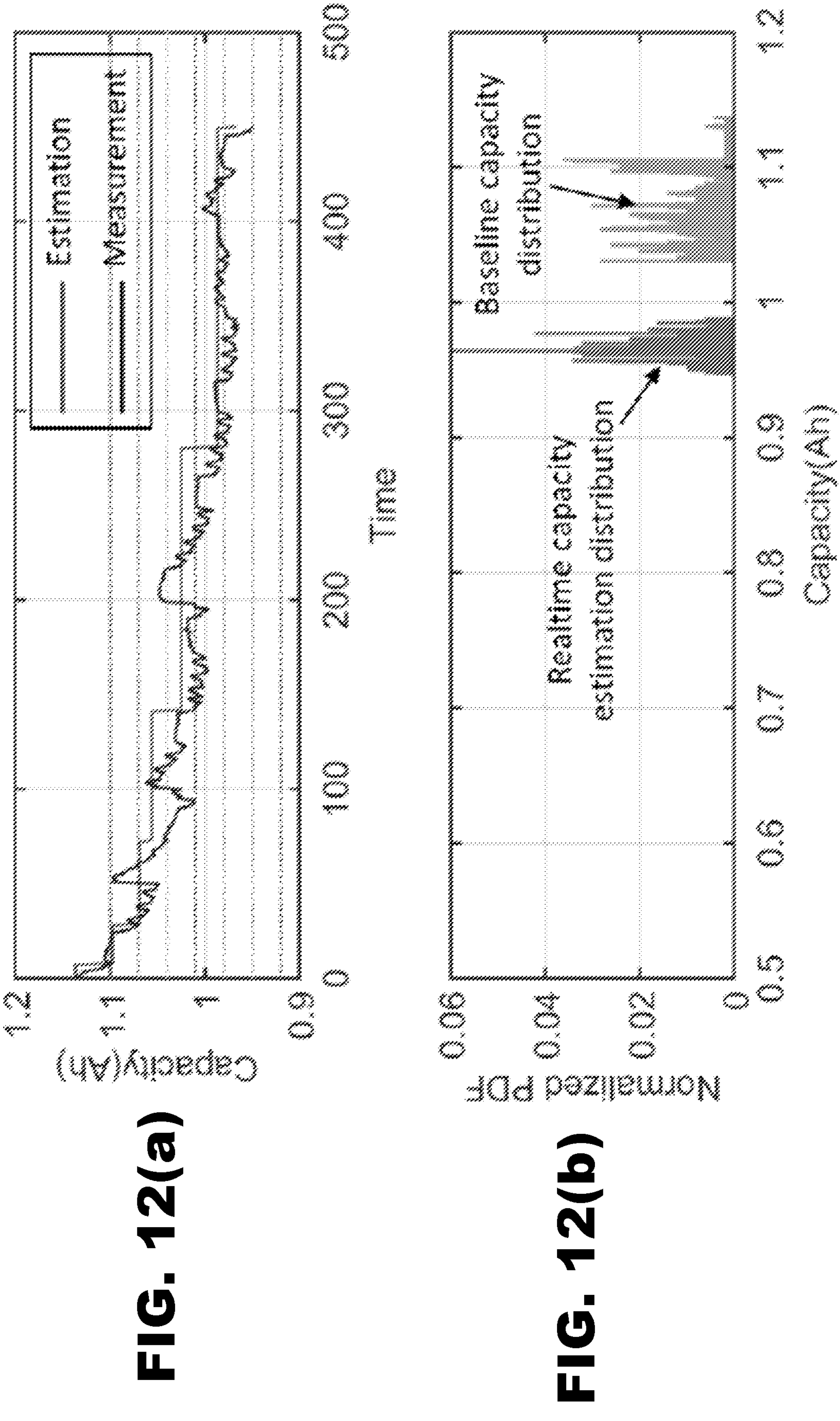
FIG. 12(*a*) graphically illustrates exemplary presently disclosed LS-DBN based diagnosis at an exemplary 450th cycle.

In the implementation, the models developed offline are integrated in the PF-based FDP algorithm. In the diagnosis stage, the particle filter is configured with 500 particles. FIG. 12(*a*) shows the diagnostic results for battery CS2_35 at the 450th cycle, and particularly shows the comparison of the mean value of the battery capacity estimation (given by red) compared with the measurements from the battery test system (given by blue), while FIG. 12(*b*) shows the comparison of the estimated current state pdf (given by magenta) with the baseline pdf (given by green).

Figure 13:
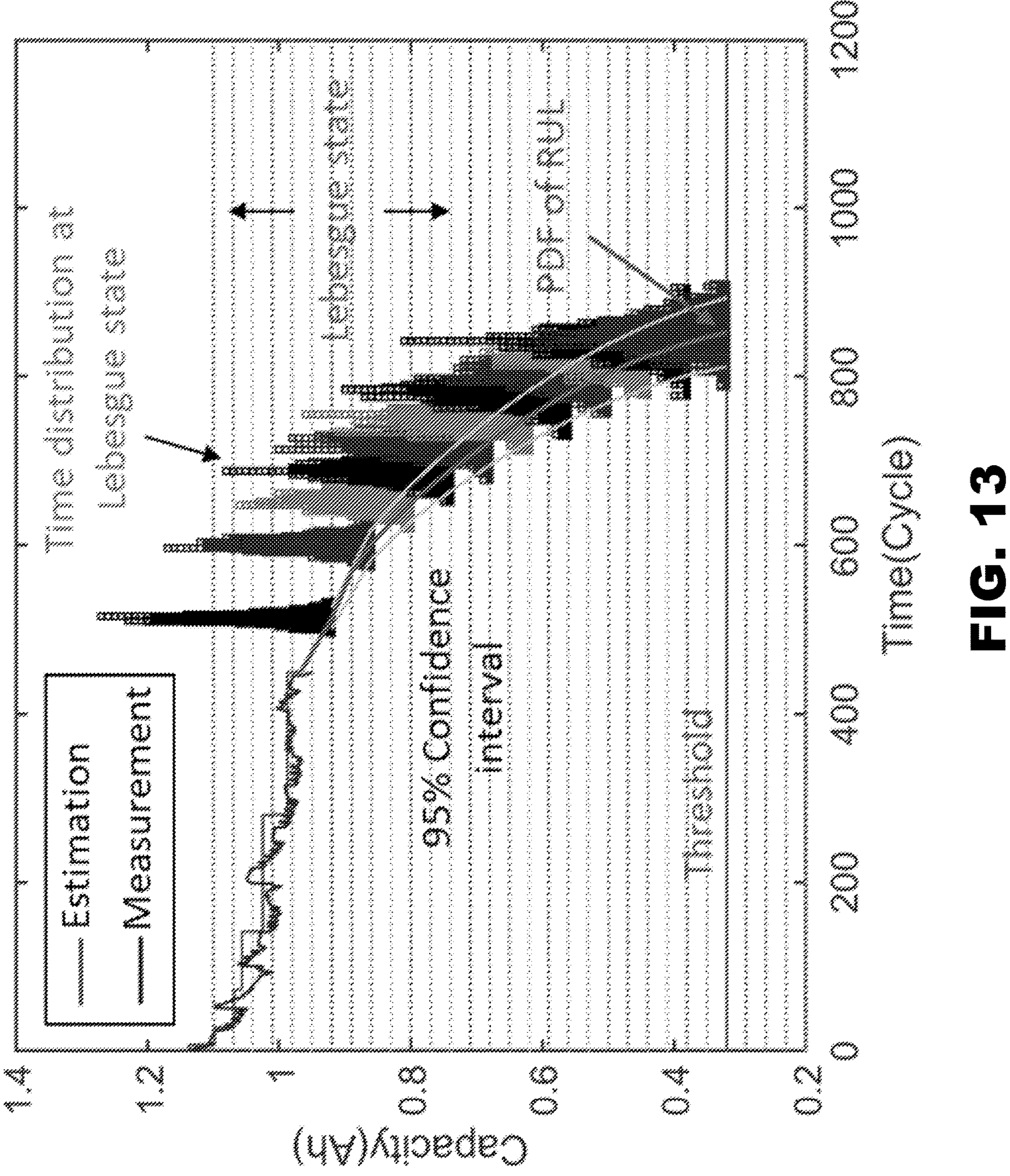
FIG. 13 graphically illustrates exemplary presently disclosed LS-DBN based prognosis at an exemplary 450th cycle.

After the posterior state distribution of the battery capacity is obtained from diagnosis, it is converted into the time distribution and is used as the initial condition for prognosis. The prognosis uses the trained LTM to predict the TTF. Since the LS-based FDP approach can reduce the computation significantly, the prognosis is also configured with 500 particles. FIG. 13 shows the prognostic result at the 450th cycle. For the predicted time distributions, this figure shows the mean value and the 95% confidence interval. To make the figure clear, only the results on some selected Lebesgue states are shown. It shows that the prediction horizon is only 22 Lebesgue states, which is much smaller than 407 cycles in RS-based prognosis. This small prediction horizon not only reduces the computation, but also benefits uncertainty management.

3) Performance analysis and comparison: To demonstrate the performance of LS-DBN-FDP, it is compared with RSFDP and model-based LS-FDP [6] in terms of accuracy and efficiency. To make fair comparison, all the related parameters and noise terms in diagnosis and prognosis are kept the same. The comparison results for battery CS2_36 at the 472nd cycle are presented in Table II. For diagnosis, the proposed FDP approach just executes 7 times in the past 472 cycles. Compared with RS-FDP approach, the reduction of computation is (472-12)/472=97.5%. Compared with model based LS-FDP approach, the reduction of computation is (56-12)/56=78.6%. Obviously, LS-DBN-FDP is more efficient in diagnosis.

TABLE II

FDP PERFORMANCE COMPARISON AT 472ND CYCLE

| CS2_36 | Variable | RS-FDP | LS_FDP | LS-DBN-FDP |
|---|---|---|---|---|
| Diagnosis | Measurement | 0.8855 | 0.8855 | 0.8855 |
| | Capa. estimated | 0.8756 | 0.9026 | 0.8949 |

TABLE II-continued

FDP PERFORMANCE COMPARISON AT 472ND CYCLE

| CS2_36 | Variable | RS-FDP | LS_FDP | LS-DBN-FDP |
|---|---|---|---|---|
| | Error | 0.0099 | 0.0171 | 0.0094 |
| | Exec. number | 472 | 56 | 12 |
| Prognosis | Ground TTF | 844 | 844 | 844 |
| | Predicted TTF | 763.3 | 859.9 | 839.3 |
| | TTF_Enor | 80.7 | 15.9 | 47 |
| | Exec. number | 291 | 25 | 24 |

In prognosis, the predicted TTF of LS-DBN-FDP is 839.3 cycles with an error of 4.7 cycles from the ground truth at the 472nd cycle. The prediction error is smaller than the prediction errors of 80.7 cycles and 15.9 cycles based on RS-FDP and model based LS-FDP, respectively. In terms of efficiency, LSDBN-FDP just executes 24 times, which shows comparable efficiency with LS-FDP (due to the same setting of Lebesgue states). Compared with RS-FDP approach, the reduction of computation is (291-21)/291=92.8%. The performance of the proposed method is better than that of RS-FDP and model-based LS-FDP.

Figures 14A, 14B, 14C, 14D:
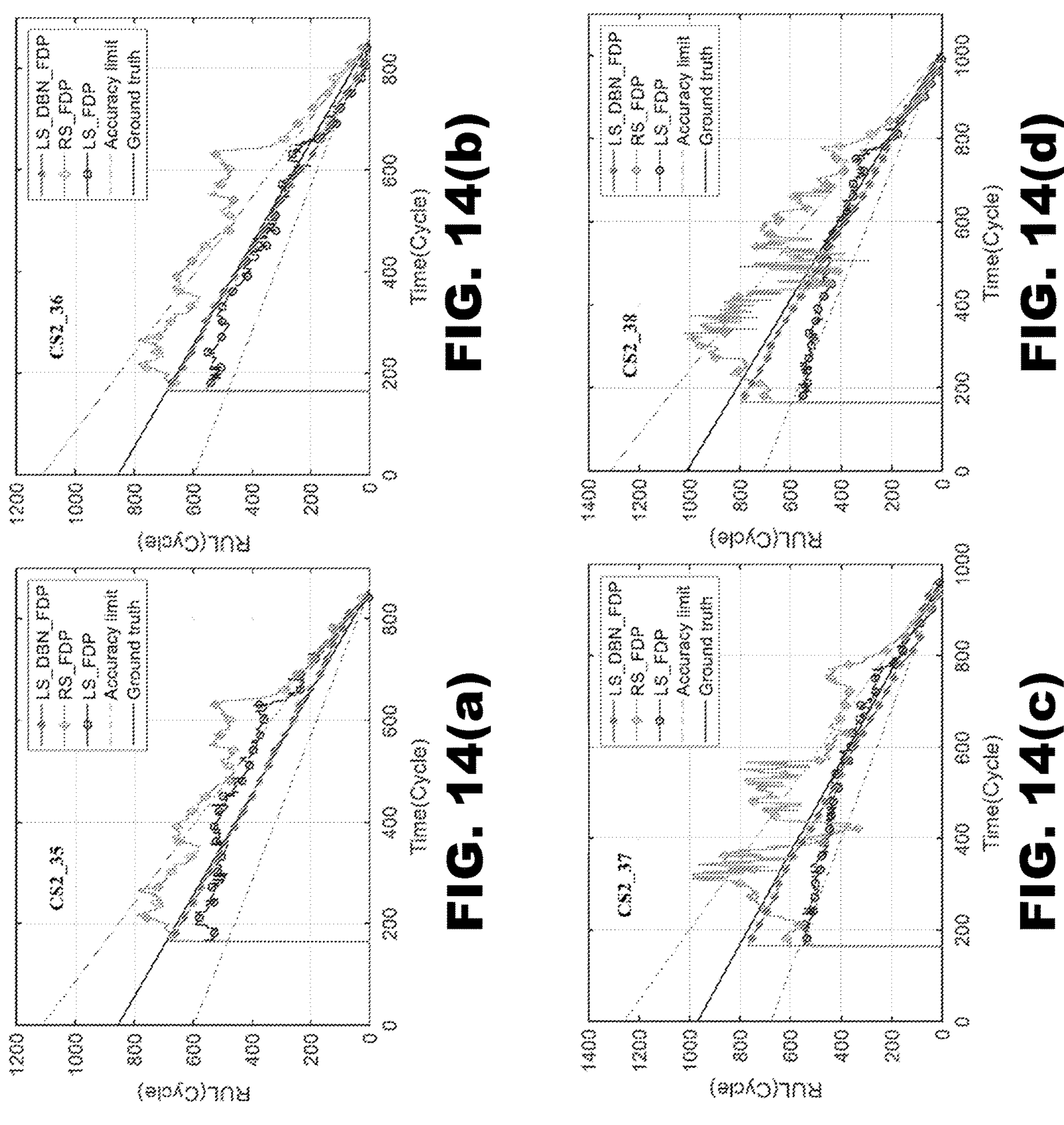
FIGS. 14(*a*) through 14(*d*) graphically illustrate the a-A metrics of four respective exemplary batteries and comparisons with the RS-FDP and presently disclosed model based LS-FDP approaches.

To demonstrate the RUL prediction accuracy in the whole battery life, a-A metrics with a=0:3 is used. This metrics shows whether the predicted RUL at any particular time instant falls into a defined precision range. FIGS. 14(*a*) through 14(*d*) show the a-A metrics of all batteries and its comparison with the RS-FDP and model based LS-FDP approaches. In particular, FIG. 14(*a*) shows such comparison for battery CS2_35, FIG. 14(*b*) shows such comparison for battery CS2_36, FIG. 14(*c*) shows such comparison for battery CS2_37, and FIG. 14(*d*) shows such comparison for battery CS2_38. To make a fair comparison, all the predictions start from the 165th cycle. The magenta line is the RUL prediction of the proposed method. Compared with the other two approaches, the proposed method has smaller prediction RUL fluctuation and higher prediction accuracy. The comparison results further verify the effectiveness of the proposed approach.

Figures 15A, 15B, 15C, 15D, 15E:
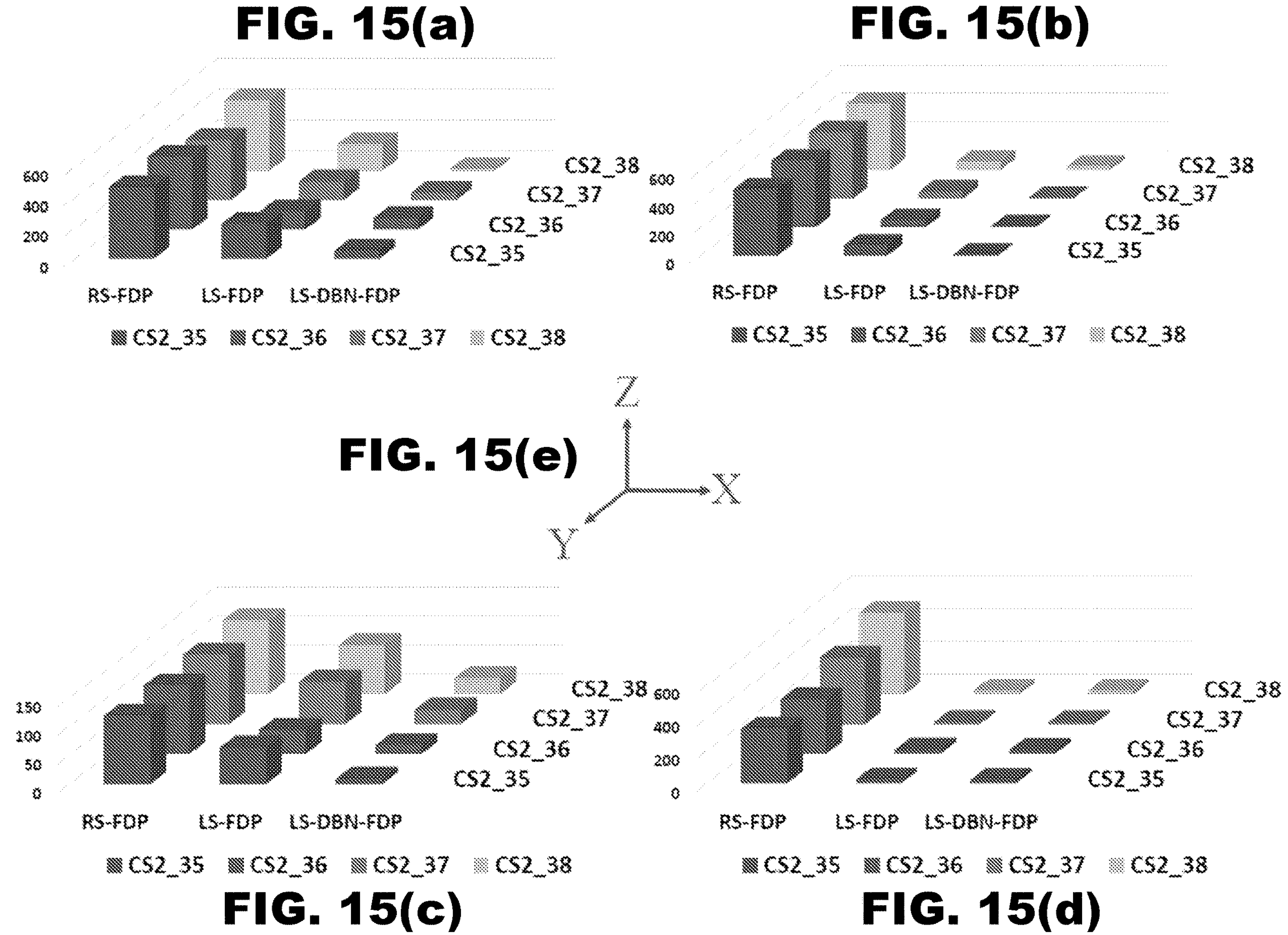
FIGS. 15(*a*) through 15(*d*) respectively graphically provide visual comparisons of results for four batteries using different analytical methods including the presently disclosed FDP methods.

Based on the above analysis, FIGS. 15(*a*) through 15(*d*) provide a visual comparison results for 4 batteries with different FDP methods. The X-axes of the subfigures represent different FDP methods, the Y-axes are different batteries, and the Z-axes are different evaluation metrics. FIG. 15(*a*) shows the number of the predicted RUL falls out of the accuracy zone. FIG. 15(*b*) is the execution times of diagnosis at the 472nd cycle. FIG. 15(*c*) demonstrates the average prediction errors of TTF in the whole life. FIG. 15(*d*) is the execution times of prognosis at the 472nd cycle. FIG. 15(*e*) illustrates the relative orientations of the X, Y, and Z axes. It can be clearly found that LS-DBN-FDP has a better performance in accuracy and efficiency.

B. Experimental Verification: Online Experiments

Figure 16:
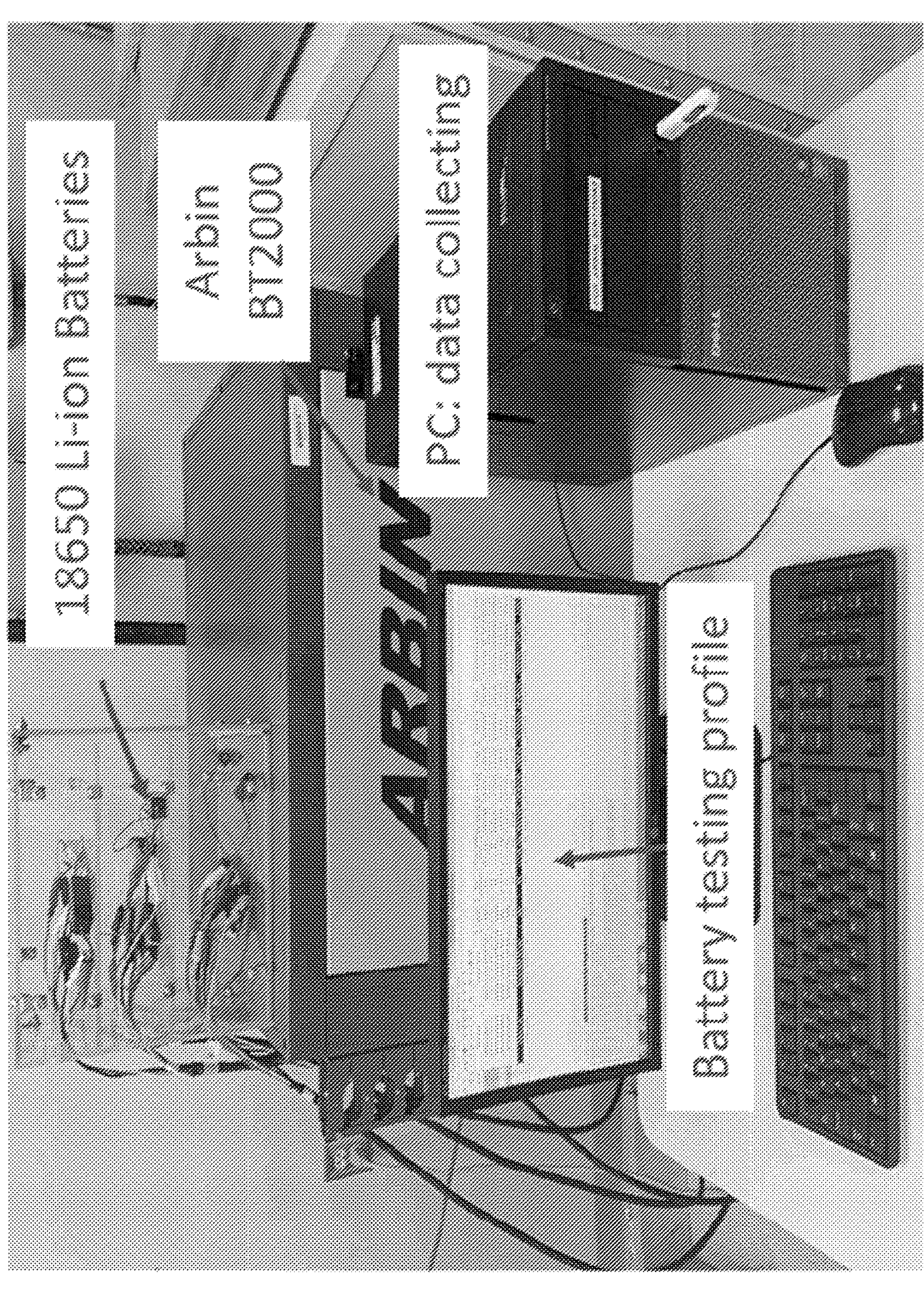
FIG. 16 represents a battery testing system used for assessing presently disclosed subject matter.

To further verify the performance of LS-DBN-FDP, experiments on four Sony 18650 lithium-ion batteries are conducted as shown in FIG. 16, which includes an Arbin BT2000 battery testing system and a data collecting and processing computer.

Figures 17, 18:
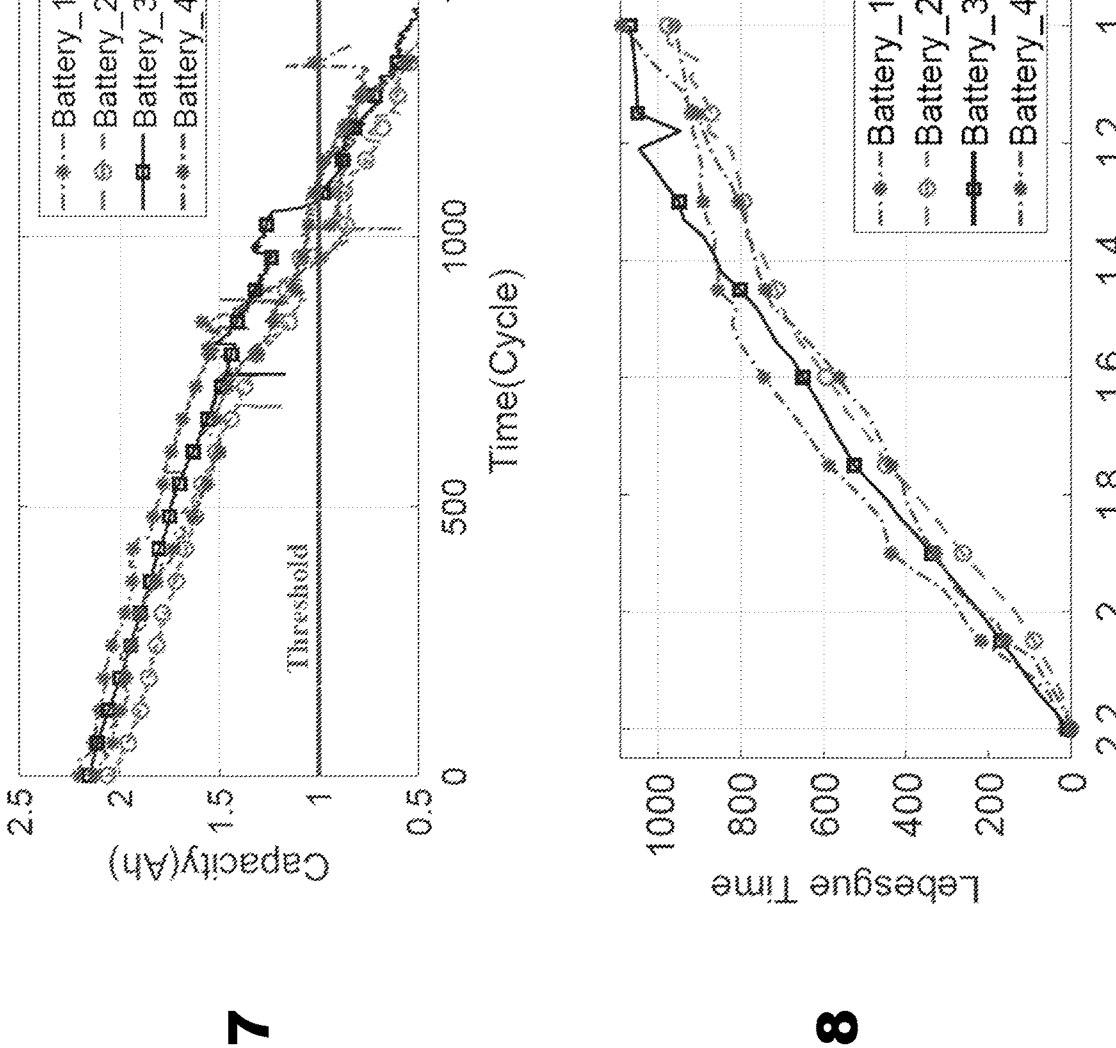
FIG. 17 graphically illustrates battery testing data as obtained with tests performed during use of equipment represented in present FIG. 16.
FIG. 18 graphically illustrates the extracted Lebesgue time measurement transition curves based on the presently disclosed Lebesgue-time extraction strategy described in conjunction with FIG. 2 herewith.

FIG. 17 shows the raw battery testing data with a rated capacity of 2.2 Ah. In most real industry applications, the batteries are replaced when the capacity degenerates to 65%~ 80% of the rated capacity. In the experimental verification, the failure threshold is set as 1 Ah and the Lebesgue length is set as 0.025 Ah, which yields 48 Lebesgue states. It can be seen from the figure that the battery data contain very large noises, which makes diagnosis and prognosis challenging. FIG. 18 shows the extracted Lebesgue time transition curves based on the Lebesgue-time extraction strategy described in FIG. 2.

Figures 19A, 19B:
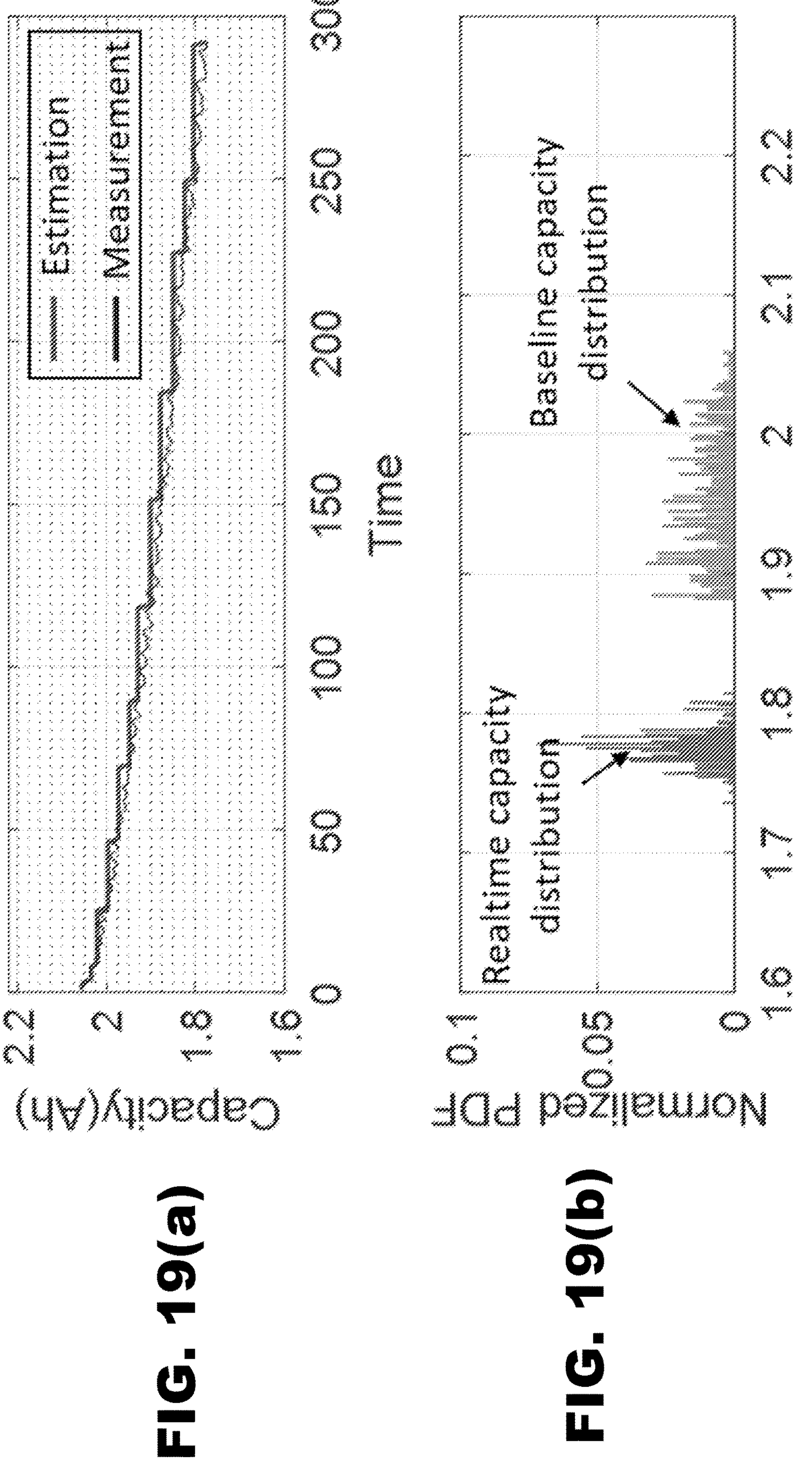
FIG. 19(*a*) graphically illustrates exemplary presently disclosed LS-DBN based diagnosis at an exemplary 270th cycle.
Figure 20:
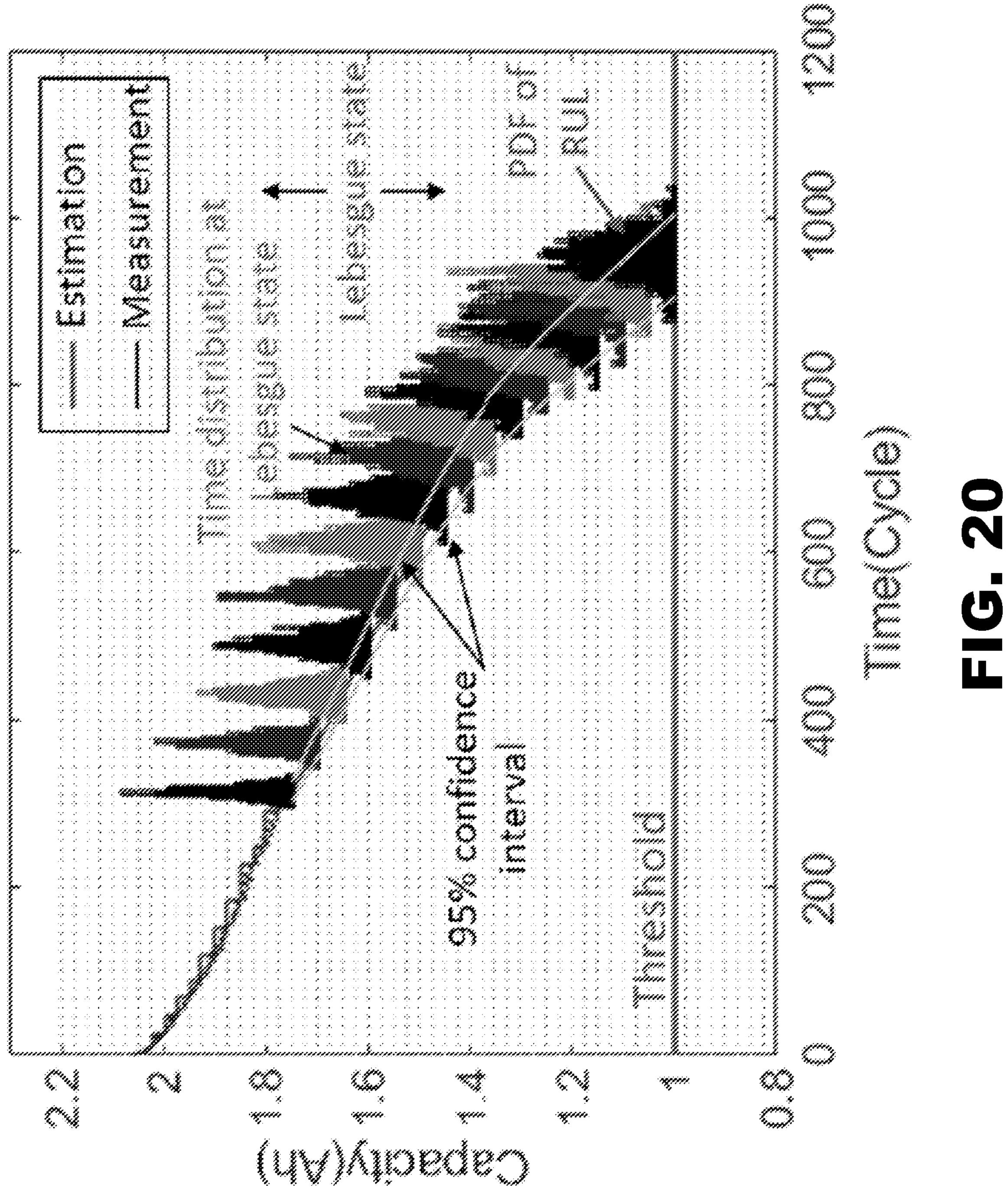
FIG. 20 graphically illustrates exemplary presently disclosed LS-DBN based prognosis at an exemplary 270th cycle.

From the data in FIGS. 17 and 18, the state space model and LTM for diagnosis and prognosis are constructed. FIGS. 19(*a*) and 19(*b*) show the diagnosis results and FIG. 20 shows the prognosis results, both at the 270th cycle. In particular, FIG. 19(*a*) shows the comparison of the mean value of the battery capacity estimation (given by red) compared with the measurements from the battery test system (given by blue), while FIG. 19(*b*) shows the comparison of the estimated current state pdf (given by magenta) with the baseline pdf (given by green). The diagnostic algorithm is only implemented 12 times in the past 270 cycles, which reduces the computation of RS-based diagnosis by (270−12)/270=95.6%. The predicted TTF is 955.3 with the 95% confidence interval of [905.8 1005]. Compared with the ground truth TTF at the 978th cycle, the prediction error is small and FDP performance is good.

Figures 21A, 21B, 21C, 21D:
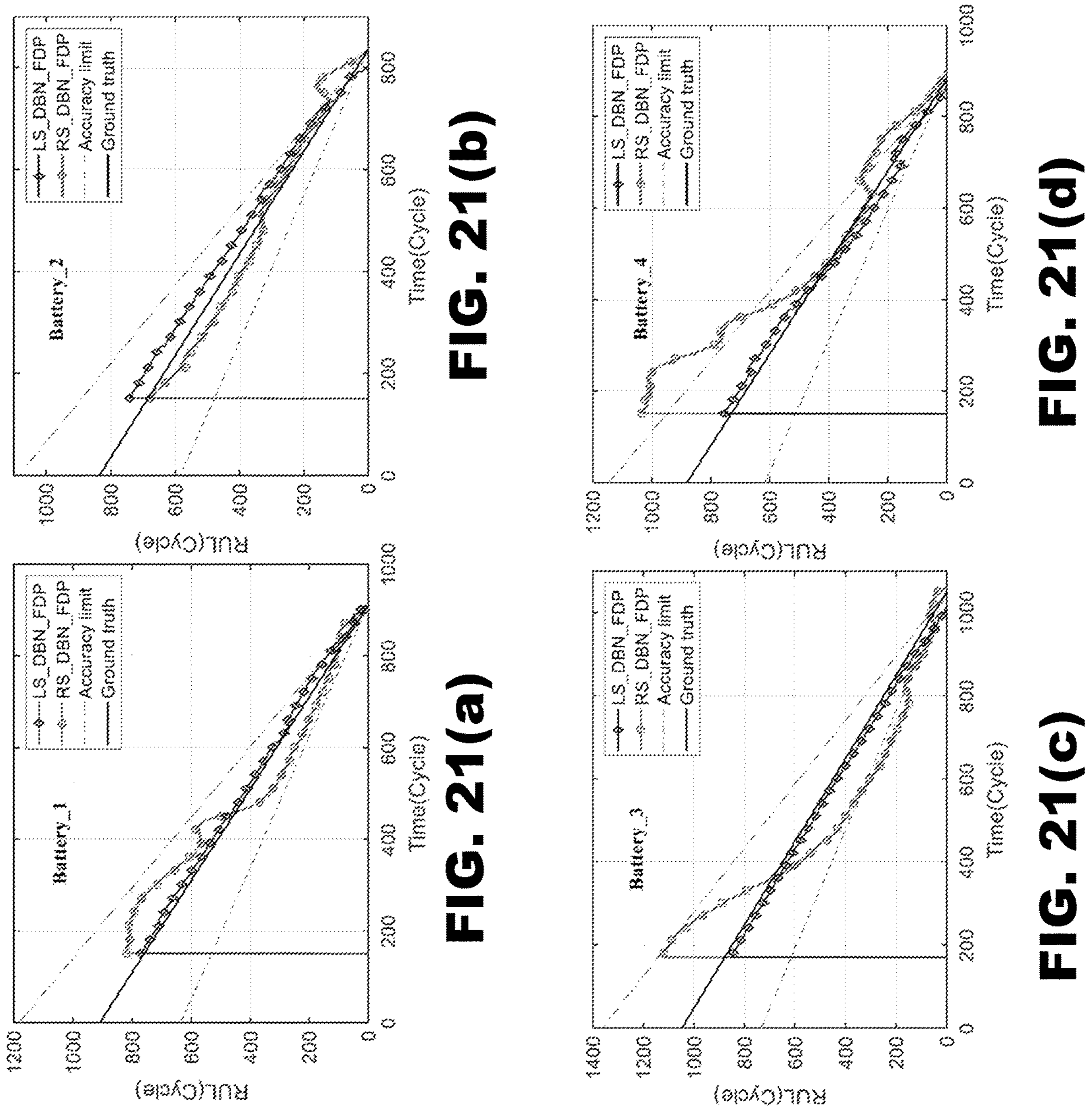
FIGS. 21(*a*) through 21(*d*) respectively show the presently disclosed remaining useful life (RUL) prediction results of leave-one-out validation of four exemplary batteries in terms of a-A metrics with a=0:3.

For the prognosis performance in the whole life, FIGS. 21(*a*) through 21(*d*) show the results of leave-one-out validation of the four batteries in terms of a-A metrics with a=0:3. In particular, FIG. 21(*a*) shows such comparison for battery_1, FIG. 21(*b*) shows such comparison for battery_2, FIG. 21(*c*) shows such comparison for battery_3, and FIG. 21(*d*) shows such comparison for battery_4. To show the advantages of the proposed approach, it is compared with RS-DBN-FDP approach. The results show that the predicted RUL of the proposed approach is stable and always falls in the accuracy zone. In contract, the predicted RUL of RS-DBNFDP has larger fluctuation and lower accuracy than that of the proposed LS-DBN-FDP. It is clear that LS-DBN-FDP is able to accommodate the uncertainties among different batteries, which is desirable in practical applications.

V. Conclusions

This present disclosure presents a data-driven approach that integrates DBNs and particle filtering in a Lebesgue sampling-based FDP framework. This approach takes advantages of the strong automatic learning capability of DBN, the uncertainty management capability of Bayesian estimation, and the cost-efficiency of the LS-based FDP framework, to achieve computation-efficiency and accuracy of FDP. The design of the DBN, the training of state space model for diagnosis, the training of Lebesgue time model for prognosis, and the system integration are discussed in detail. The proposed method is verified with two battery case studies. The verification results and comparisons demonstrate that the proposed method has a significant improvement in real-time condition estimation and RUL prediction in terms of accuracy and efficiency. In this work, however, the Lebesgue length and related parameters of the method are manually selected, which can be further optimized to improve the execution efficiency. Our future work will focus on developing an efficient, optimal, and adaptive parameter setting mechanism based on fault dynamics for the proposed method.

This written description uses examples to disclose the presently disclosed subject matter, including the best mode, and also to enable any person skilled in the art to practice the presently disclosed subject matter, including making and using any devices or systems and performing any incorporated methods. The patentable scope of the presently disclosed subject matter is defined by the claims, and may include other examples that occur to those skilled in the art. Such other examples are intended to be within the scope of the claims if they include structural and/or step elements that do not differ from the literal language of the claims, or if they include equivalent structural and/or elements with insubstantial differences from the literal languages of the claims.

REFERENCES

[1] H. Zhang, G. Niu, B. Zhang, and Q. Miao, "Cost-effective lebesgue sampling long short-term memory networks for lithium-ion batteries diagnosis and prognosis," *IEEE Transactions on Industrial Electronics,* 2021.

[2] M. E. Orchard and G. J. Vachtsevanos, "A particle-filtering approach for on-line fault diagnosis and failure prognosis," *Transactions of the Institute of Measurement and Control*, vol. 31, no. 3-4, pp. 221-246, 2009.

[3] W. Yan, B. Zhang, X. Wang, W. Dou, and J. Wang, "Lebesgue sampling-based diagnosis and prognosis for lithium-ion batteries," *IEEE Transactions on Industrial Electronics*, vol. 63, no. 3, pp. 1804-1812, 2016.

[4] L. Zhang, W. Fan, Z. Wang, W. Li, and D. U. Sauer, "Battery heating for lithium-ion batteries based on multi-stage alternative currents," *Journal of Energy Storage*, vol. 32, p. 101885, 2020.

[5] W. Yan, B. Zhang, W. Dou, D. Liu, and Y. Peng, "Low-cost adaptive lebesgue sampling particle filtering approach for real-time li-ion battery diagnosis and prognosis," *IEEE Transactions on Automation Science and Engineering*, vol. 14, no. 4, pp. 1601-1611, 2017.

[6] W. Yan, B. Zhang, X. Wang, W. Dou, and J. Wang, "Lebesgue sampling-based diagnosis and prognosis for lithium-ion batteries," *IEEE Transactions on Industrial Electronics*, vol. 63, no. 3, pp. 1804-1812, 2015.

[7] Y. Lei, B. Yang, X. Jiang, F. Jia, N. Li, and A. K. Nandi, "Applications of machine learning to machine fault diagnosis: A review and roadmap," *Mechanical Systems and Signal Processing*, vol. 138, p. 106587, 2020.

[8] H. Zhang, Q. Miao, X. Zhang, and Z. Liu, "An improved unscented particle filter approach for lithium-ion battery remaining useful life prediction," *Microelectronics Reliability*, vol. 81, pp. 288-298, 2018.

[9] Y. Zhang, R. Xiong, H. He, and M. G. Pecht, "Lithium-ion battery remaining useful life prediction with box-cox transformation and monte carlo simulation," *IEEE Transactions on Industrial Electronics*, vol. 66, no. 2, pp. 1585-1597, 2019.

[10] P. Li, Z. Zhang, Q. Xiong, B. Ding, J. Hou, D. Luo, Y. Rong, and S. Li, "State-of-health estimation and remaining useful life prediction for the lithium-ion battery based on a variant long short term memory neural network," *Journal of power sources*, vol. 459, p. 228069, 2020.

[11] C. She, Z. Wang, F. Sun, P. Liu, and L. Zhang, "Battery aging assessment for real-world electric buses based on incremental capacity analysis and radial basis function neural network," *IEEE Transactions on Industrial Informatics*, vol. 16, no. 5, pp. 3345-3354, 2019.

[12] F. Yang, Y. Xing, D. Wang, and K.-L. Tsui, "A comparative study of three model-based algorithms for estimating state-of-charge of lithium ion batteries under a new combined dynamic loading profile," *Applied energy*, vol. 164, pp. 387-399, 2016.

[13] F. Jia, Y. Lei, J. Lin, X. Zhou, and N. Lu, "Deep neural networks: A promising tool for fault characteristic mining and intelligent diagnosis of rotating machinery with massive data," *Mechanical Systems and Signal Processing*, vol. 72, pp. 303-315, 2016.

[14] D. Wang, F. Yang, K.-L. Tsui, Q. Zhou, and S. J. Bae, "Remaining useful life prediction of lithium-ion batteries based on spherical cubature particle filter," *IEEE Transactions on Instrumentation and Measurement*, vol. 65, no. 6, pp. 1282-1291, 2016.

[15] Y. Cui, J. Shi, and Z. Wang, "Fault propagation reasoning and diagnosis for computer networks using cyclic temporal constraint network model," *IEEE Transactions on Systems, Man, and Cybernetics: Systems*, vol. 47, no. 8, pp. 1965-1978, 2016.

[16] Z. Wu, Y. Guo, W. Lin, S. Yu, and Y. Ji, "A weighted deep representation learning model for imbalanced fault diagnosis in cyber-physical systems," *Sensors*, vol. 18, no. 4, p. 1096, 2018.

[17] M. Yue, S. Jemei, R. Gouriveau, and N. Zerhouni, "Review on health conscious energy management strategies for fuel cell hybrid electric vehicles: Degradation models and strategies," *International Journal of Hydrogen Energy*, vol. 44, no. 13, pp. 6844-6861, 2019.

[18] Q. Wang, Z. Wang, L. Zhang, P. Liu, and Z. Zhang, "A novel consistency evaluation method for series-connected battery systems based on real world operation data," *IEEE Transactions on Transportation Electrification,* 2020.

[19] H. Zhang, Z. Mo, J. Wang, and Q. Miao, "Nonlinear-drifted fractional brownian motion with multiple hidden state variables for remaining useful life prediction of lithium-ion batteries," *IEEE Transactions on Reliability*, vol. 69, no. 2, pp. 768-780, 2019.

[20] Y. Lei, N. Li, L. Guo, N. Li, T. Yan, and J. Lin, "Machinery health prognostics: A systematic review from data acquisition to rul prediction," *Mechanical systems and signal processing*, vol. 104, pp. 799-834, 2018.

[21] S. Liu, J. Xie, C. Shen, X. Shang, D. Wang, and Z. Zhu, "Bearing fault diagnosis based on improved convolutional deep belief network," *Applied Sciences*, vol. 10, no. 18, p. 6359, 2020.

[22] L. Zhao, Y. Zhou, H. Lu, and H. Fujita, "Parallel computing method of deep belief networks and its application to traffic flow prediction," *Knowledge-Based Systems*, vol. 163, pp. 972-987, 2019.

[23] Z. Chen and W. Li, "Multisensor feature fusion for bearing fault diagnosis using sparse autoencoder and deep belief network," *IEEE Transactions on Instrumentation and Measurement*, vol. 66, no. 7, pp. 1693-1702, 2017.

[24] P. Tamilselvan and P.Wang, "Failure diagnosis using deep belief learning based health state classification," *Reliability Engineering & System Safety*, vol. 115, pp. 124-135, 2013.

[25] I. Goodfellow, Y. Bengio, A. Courville, and Y. Bengio, *Deep learning*, vol. 1, no. 2. MIT press Cambridge, 2016.

[26] G. E. Hinton, "Deep belief networks," *Scholarpedia*, vol. 4, no. 5, p. 5947, 2009.

[27] G. Zhao, X. Liu, B. Zhang, G. Zhang, G. Niu, and C. Hu, "Bearing health condition prediction using deep belief network," in *Proceedings of the Annual Conference of Prognostics and Health Management Society*, Orlando, FL, USA, pp. 2-5, 2017.

[28] G. Niu, S. Tang, Z. Liu, G. Zhao, and B. Zhang, "Fault diagnosis and prognosis based on deep belief network and particle filtering," in *PHM Society Conference*, vol. 10, no. 1, 2018.

[29] D. Lyu, G. Niu, B. Zhang, G. Chen, and T. Yang, "Lebesgue-time-space model-based diagnosis and prognosis for multiple mode systems," *IEEE Transactions on Industrial Electronics*, vol. 68, no. 2, pp. 1591-1603, 2020.

[30] C. Chen, B. Zhang, and G. Vachtsevanos, "Prediction of machine health condition using neuro-fuzzy and bayesian algorithms," *IEEE Transactions on instrumentation and Measurement*, vol. 61, no. 2, pp. 297-306, 2012.

[31] W. He, N. Williard, M. Osterman, and M. Pecht, "Prognostics of lithium ion batteries based on dempster-shafer theory and the bayesian monte carlo method," *Journal of Power Sources*, vol. 196, no. 23, pp. 10 314-10 321, 2011.

[32] A. Saxena, J. Celaya, B. Saha, S. Saha, and K. Goebel, "Metrics for offline evaluation of prognostic performance," *International Journal of Prognostics and Health Management*, vol. 1, no. 1, pp. 4-23, 2010.

What is claimed is:

1. A method for performing diagnosis and prognosis for lithium-ion batteries which integrates deep learning based models with uncertainty management techniques, the method comprising:

training a machine-learned Lebesgue sampling (LS) deep belief network (DBN)-based fault state model to identify and estimate a fault state distribution at an event time for a target battery based on training data associated with at least one training lithium-ion battery;

training a machine-learned Lebesgue sampling (LS) deep belief network (DBN)-based Lebesgue time model to directly predict an operation time for a fault state to reach pre-defined Lebesgue states based on training data associated with at least one training lithium-ion battery and the fault state distribution at an event time;

obtaining test data associated with a target battery;

inputting the test data into the machine-learned fault state model;

mapping estimated current fault state distribution to a corresponding initial time distribution for a current Lebesque state;

initializing the machine-learned Lebesgue time model with the initial time distribution;

inputting the test data into the machine-learned Lebesgue time model; and receiving, as outputs of the models, diagnosis of the target battery's fault state distribution and prognosis of the target battery's remaining useful life (RUL) distribution, respectively.

2. The method according to claim 1, further comprising using a plurality of training batteries.

3. The method according to claim 1, wherein the fault state model and Lebesgue time model are respectively trained for diagnosis and prognosis, with the input for the diagnostic model comprising a vector of fault state, and the input for the prognostic model comprising a vector of time measurement for fault state reaching previous Lebesgue states.

4. The method according to claim 3, wherein the output for the diagnostic model is the fault state at the time of a Lebesgue event, and the output for the prognostic model comprises the operating time for the fault state reaching the next Lebesgue state.

5. The method according to claim 4, wherein LS-based diagnosis is executed only when measurement causes the transition of Lebesgue state, which is still executed over time to estimate the fault state but not periodically.

6. The method according to claim 5, wherein LS-based prognosis is executed over Lebesgue states to predict a time for the fault state to reach each Lebesgue state from a current Lebesgue state.

7. The method according to claim 6, wherein the LS-based prognosis predicts a time distribution directly, and based on the estimated fault state distribution and current Lebesgue state, the distribution of the operating time for a fault state reaching each future Lebesgue state is predicted using a Lebesgue time model (LTM) described as:

$$t(L_{k+1}) = g(L_k, t(L_k), D) + \omega_t(L_k)$$

where $g(\cdot)$ is the time transition function that describes the time evolution for a fault reaching Lebesgue state, $L_k$ and $L_{k+1}$ are the two adjacent Lebesgue states, D is the Lebesgue length, and $\omega_t$ is the process noise in the time transition process.

8. The method according to claim 3, wherein the diagnosis and prognosis models respectively estimate a current fault state and predict the time-to-failure (TTF) using Bayesian estimation techniques involving prediction and filtering processes.

9. The method according to claim 8, wherein the prediction process is defined as:

$$p(x_{0:k}|y_{1:k-1}) = \int p(x_k|x_{0:k-1})p(x_{0:k-1}|y_{1:k-1})dx_{0:k-1}$$

where $p(\omega_{k-1}|y_{1:k-1})$ is the marginal distribution.

10. The method according to claim 9, wherein the filtering process is conducted with a new measurement to get the posterior probability distribution $p(x_k|y_{1:k})$, which is given as:

$$p(x_{0:k} \mid y_{1:k}) = \frac{p(y_k \mid x_k)p(x_k \mid y_{1:k-1})}{p(y_k \mid y_{1:k-1})}.$$

11. The method according to claim 9, wherein the filtering process comprises a Sequential Monte Carlo (SMC) method (particle filter), with particles used to approximate a desired fault state distribution.

12. The method according to claim 1, wherein diagnosis is an event-trigger based approach.

13. The method according to claim 12, wherein the event-trigger based approach comprises in a battery state-of-health (SOH) degradation case an event checker, in which an upper boundary of the checker is used as a trigger to perform the diagnosis once measurement falls below the checker.

14. The method according to claim 1, wherein corresponding time distributions for all future Lebesgue states are predicted recursively, with TTF distribution obtained on a Lebesgue state defined on a failure threshold.

15. A system for performing battery diagnosis and prognosis for lithium-ion batteries, comprising:

a machine-learned Lebesgue sampling (LS) deep belief network (DBN)-based fault state model trained to identify and estimate a fault state distribution at an event time for a target battery based on training data associated with at least one training lithium-ion battery;

a machine-learned Lebesgue sampling (LS) deep belief network (DBN)-based Lebesgue time model trained to directly predict an operation time for a fault state to reach pre-defined Lebesgue states based on training data associated with at least one training lithium-ion battery and the fault state distribution at an event time;

one or more processors; and one or more non-transitory computer-readable media that store instructions that, when executed by the one or more processors, cause the one or more processors to perform operations, the operations comprising:

obtaining test data associated with a target battery;

inputting the test data into the machine-learned fault state model;

mapping estimated current fault state distribution to a corresponding initial time distribution for a current Lebesque state;

initializing the machine-learned Lebesgue time model with the initial time distribution;

inputting the test data into the machine-learned Lebesgue time model; and receiving, as outputs of the models, diagnosis of the target battery's fault state distribution and prognosis of the target battery's remaining useful life (RUL) distribution, respectively.

16. The system according to claim 15, further comprising using a plurality of training batteries.

17. The system according to claim 15, wherein the one or more processors are further programmed to perform operations for respectively training the fault state model and Lebesgue time model for diagnosis and prognosis, with the input for the diagnostic model comprising a vector of fault state, and the input for the prognostic model comprising a vector of time measurement for fault state reaching previous Lebesgue states.

18. The system according to claim 17, wherein the one or more processors are further programmed to perform operations for the output for the diagnostic model to comprise the fault state at the time of a Lebesgue event, and for the output for the prognostic model to comprise the operating time for the fault state reaching the next Lebesgue state.

19. The system according to claim 18, wherein the one or more processors are further programmed to perform operations so that LS-based diagnosis is executed only when measurement causes the transition of Lebesgue state, which is still executed over time to estimate the fault state but not periodically.

20. The system according to claim 19, wherein the one or more processors are further programmed to perform operations so that LS-based prognosis is executed over Lebesgue states to predict a time for the fault state to reach each Lebesgue state from a current Lebesgue state.

21. The system according to claim 20, wherein the one or more processors are further programmed to perform operations so that the LS-based prognosis predicts a time distribution directly, and based on the estimated fault state distribution and current Lebesgue state, so that the distribution of the operating time for a fault state reaching each future Lebesgue state is predicted using a Lebesgue time model (LTM) described as:

$$t(L_{k+1}) = g(L_k, t(L_k), D) + \omega_t(L_k)$$

where $g(\cdot)$ is the time transition function that describes the time evolution for a fault reaching Lebesgue state, $L_k$ and $L_{k+1}$ are the two adjacent Lebesgue states, Dis the Lebesgue length, and $\omega_t$ is the process noise in the time transition process.

22. The system according to claim 17, wherein the one or more processors are further programmed to perform operations so that the diagnosis and prognosis models respectively estimate a current fault state and predict the time-to-failure (TTF) using Bayesian estimation techniques involving prediction and filtering processes.

23. The system according to claim 22, wherein the one or more processors are further programmed to perform operations so that the prediction process is defined as:

$$p(x_{0:k}|y_{1:k-1}) = \int p(x_k|x_{0:k-1})p(x_{0:k-1}|y_{1:k-1})dx_{0:k-1}$$

where $p(_{k-1}|y_{1:k-1})$ is the marginal distribution.

24. The system according to claim 23, wherein the one or more processors are further programmed to perform operations so that the filtering process is conducted with a new measurement to get the posterior probability distribution $p(x_k|y_{1:k})$, which is given as:

$$p(x_{0:k} \mid y_{1:k}) = \frac{p(y_k \mid x_k)p(x_k \mid y_{1:k-1})}{p(y_k \mid y_{1:k-1})}.$$

25. The system according to claim 23, wherein the one or more processors are further programmed to perform operations so that the filtering process comprises a Sequential Monte Carlo (SMC) method (particle filter), with particles used to approximate a desired fault state distribution.

26. The system according to claim 15, wherein the one or more processors are further programmed to perform operations so that diagnosis is an event-trigger based approach.

27. The system according to claim 26, wherein the one or more processors are further programmed to perform operations so that the event-trigger based approach comprises in a battery state-of-health (SOH) degradation case an event checker, in which an upper boundary of the checker is used as a trigger to perform the diagnosis once measurement falls below the checker.

28. The system according to claim 15, wherein corresponding time distributions for all future Lebesgue states are predicted recursively, with TTF distribution obtained on a Lebesgue state defined on a failure threshold.

29. A method for performing state-of-charge (SOC) diagnosis and prognosis for lithium-ion batteries which integrates deep belief networks for data processing and modeling with particle filtering (PF) for Bayesian estimation in Lebesgue sampling (LS) for uncertainty management, the method comprising:

training a machine-learned Lebesgue sampling (LS) deep belief network (DBN)-based fault state model to identify and estimate a fault state distribution at an event time for a target battery based on training data associated with a plurality of training lithium-ion batteries;

training a machine-learned Lebesgue sampling (LS) deep belief network (DBN)-based Lebesgue time model to directly predict an operation time for a fault state to reach pre-defined Lebesgue states based on training data associated with a plurality of training lithium-ion batteries and the fault state distribution at an event time;

obtaining test data associated with a target battery;

inputting the test data into the machine-learned fault state model;

mapping estimated current fault state distribution to a corresponding initial time distribution for a current Lebesgue state;

initializing the machine-learned Lebesgue time model with the initial time distribution;

inputting the test data into the machine-learned Lebesgue time model; and receiving, as outputs of the models, diagnosis of the target battery's fault state distribution and prognosis of the target battery's remaining useful life (RUL) distribution, respectively, using respective different models.

30. The method according to claim 29, wherein in LS-based prognosis, a Lebesgue time distribution is obtained, and the prognostic is conducted over a Lebesgue state.

31. The method according to claim 30, wherein in LS-based prognosis, the RUL is predicted directly at a failure Lebesgue state $L_f$.

32. The method according to claim 29, wherein the LS-based prognosis uses a Lebesgue time model (LTM) to directly predict the operation time for a fault state reaching Lebesgue states.

33. The method according to claim 32, wherein the LTM is described as:

$$t(L_{k+1}) = g(L_k, t(L_k), D) + \omega_t(L_k)$$

where $g(\cdot)$ is the time transition function that describes the time evolution for a fault reaching Lebesgue state, $L_k$ and $L_{k+1}$ are the two adjacent Lebesgue states, Dis the Lebesgue length, and $\omega_t$ is the process noise in the time transition process.

34. The method according to claim 32, wherein with the prognostic model, n particles $$\{(t^i_{L_k}, w^i_{L_k}), (t^i_{L_{k-1}}, w^i_{L_{k-1}}), \ldots , (t^i_{L_{k-n}}, w^i_{L_{k-n}})\}$$

are established from an estimated fault state, where n=the input size of the model, $$w^i_{L_k}$$

is the particle weight, and $$t^i_{L_k}$$

is the particle location on the time axis.

35. The method according to claim 29, wherein prognosis comprises an iterative prediction process with the prediction steps $[L_{k+1}, L_{k+2}, \ldots , L_f]$, where $L_f$ denotes the failure Lebesgue state, and the expectations of the prognosis are the operating time distribution for the fault reaching the Lebesgue states.

36. The method according to claim 35, wherein the prognosis output can be denoted as $[t(L_{k+1}), t(L_{k+2}), \ldots , t(L_f)]$.

37. The method according to claim 29, wherein the fault state model is used in the diagnosis process to estimate a current fault state.

38. The method according to claim 37, wherein per the fault state model, the fault growth dynamics are described as:

$$x_k = f(x_{k-1}, D, \omega_k)$$

$$z_k = h(x_k, v_k)$$

where k is event stamp, D is the Lebesgue length, x is the system state, $f(\cdot)$ depicts the system state transition regularity, $\omega_k$ is the process noise, $h(\cdot)$ is the measurement equation, z is the state measurement, and $v_k$ is the measurement noise.

* * * * *